United States Patent
Kitaoka et al.

(10) Patent No.: US 7,082,146 B2
(45) Date of Patent: Jul. 25, 2006

(54) DEVICE AND METHOD FOR INSPECTING WAVELENGTH-VARIABLE SEMICONDUCTOR LASER, AND METHOD FOR INSPECTING COHERENT SOURCE

(75) Inventors: Yasuo Kitaoka, Ibaraki (JP); Toshifumi Yokoyama, Katano (JP); Kazuhisa Yamamoto, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/197,624

(22) Filed: Aug. 4, 2005

(65) Prior Publication Data

US 2005/0276288 A1 Dec. 15, 2005

Related U.S. Application Data

(62) Division of application No. 10/222,765, filed on Aug. 16, 2002, now abandoned.

(51) Int. Cl.
*H01S 3/10* (2006.01)
(52) U.S. Cl. .......................................... 372/22; 372/20
(58) Field of Classification Search ............. 372/20–22
See application file for complete search history.

(56) References Cited

U.S. PATENT DOCUMENTS

| 5,243,608 A |   | 9/1993 | Chawki et al. |
| 5,325,382 A | * | 6/1994 | Emura et al. ................. 372/26 |
| 5,450,428 A |   | 9/1995 | Maeda |
| 5,642,371 A |   | 6/1997 | Tohyama et al. |
| 5,777,762 A |   | 7/1998 | Yamamoto |
| 5,835,650 A | * | 11/1998 | Kitaoka et al. ............... 385/49 |

(Continued)

FOREIGN PATENT DOCUMENTS

JP 10-41589 2/1998

OTHER PUBLICATIONS

Yokoyama, et al., "Power stabilizing method of the blue light source using quasi-phase-matched second harmonic generation", Journal of T. IEE Japan, vol. 120-C. No. 7, 2000, pp. 938-944.

(Continued)

*Primary Examiner*—Minsun Harvey
*Assistant Examiner*—Phillip Nguyen
(74) *Attorney, Agent, or Firm*—Hamre, Schumann, Mueller & Larson, P.C.

(57) ABSTRACT

A method for easily and quickly evaluating the wavelength variability properties of a wavelength-variable semiconductor laser is provided. An inspection device includes a power source for supplying current to a wavelength-variable DBR semiconductor laser having an active region, a phase control region, and a DBR region, a photo-detector for detecting an output intensity of laser beam emitted from the wavelength-variable DBR semiconductor laser, and a transmission type wavelength-selection element that can be inserted into a light path from the wavelength-variable DBR semiconductor laser to the photo-detector. In a state where the transmission type wavelength-selection element is inserted into the light path from the wavelength-variable DBR semiconductor laser to the photo-detector, at least one of a phase current that is supplied to the phase control region and a DBR current that is supplied to the DBR region is changed with respect to a predetermined active current that is supplied to the active region, and the output intensity of the laser beam after the laser beam has passed through the transmission type wavelength-selection element is detected by the photo-detector.

7 Claims, 11 Drawing Sheets

U.S. PATENT DOCUMENTS

| | | | |
|---|---|---|---|
| 5,936,985 A * | 8/1999 | Yamamoto et al. | 372/31 |
| 6,067,393 A | 5/2000 | Kitaoka et al. | |
| 6,069,904 A | 5/2000 | Kitaoka et al. | |
| 6,501,868 B1 * | 12/2002 | Kitaoka et al. | 385/14 |
| 6,590,915 B1 * | 7/2003 | Kitaoka et al. | 372/38.02 |
| 6,671,297 B1 * | 12/2003 | Takayama | 372/22 |
| 6,738,398 B1 * | 5/2004 | Hirata et al. | 372/32 |
| 7,010,006 B1 * | 3/2006 | Kasazumi et al. | 372/29.02 |
| 2002/0181521 A1 | 12/2002 | Crowder et al. | |

OTHER PUBLICATIONS

Kitaoka, et al., "Intracavity frequency doubling of a ND: YVO$_4$ laser pumped by a wavelength-locked laser diode using a transmission-type optical filter", Optical Letters, Juen 1, 1994, vol. 19, No. 11, pp. 810-812.

* cited by examiner

DEVICE AND METHOD FOR INSPECTING WAVELENGTH-VARIABLE SEMICONDUCTOR LASER, AND METHOD FOR INSPECTING COHERENT SOURCE

This application is a Division of application Ser. No. 10/222,765, filed Aug. 16, 2002 now abandoned, which application is incorporated herein by reference.

BACKGROUND OF THE INVENTION

1. Field of the Invention

The present invention relates to devices and methods for inspecting wavelength-variable semiconductor lasers that have a wavelength varying function and that are employed for optical communications and second harmonic generation, for example, and methods for inspecting coherent light sources.

2. Description of the Related Art

In recent years, semiconductor lasers having a wavelength varying function have found application in the field of optical communications, for example, and have garnered attention as the fundamental wave for second harmonic generation using nonlinear effects. Distributed feedback (DFB) semiconductor lasers and distributed Bragg reflector (DBR) semiconductor lasers, in which a grating has been integrated onto the semiconductor laser, are semiconductor lasers where the laser can oscillate in a single longitudinal mode. At present, DBR semiconductor lasers and DFB semiconductor lasers are components that are essential for achieving long-distance, high capacity optical communications systems.

As a wavelength variation technique, a method has been proposed in which the oscillation wavelength is tuned by supplying current to the DBR portion of a DBR semiconductor laser to change the refractive index through plasma effects and changes in temperature.

Hereinafter, a DBR semiconductor laser having a wavelength varying function is described (Yokoyama, et al, Transaction of Institute of Electrical Engineers of Japan C, Vol. 120-C, p. 938, 2000). FIG. 14 schematically shows the configuration of an AlGaAs wavelength-variable DBR semiconductor laser with a three-electrode structure.

As shown in FIG. 14, a wavelength-variable DBR semiconductor laser 34 has three regions: an active region 35; a phase control region 36; and a DBR region 37. A method of fabricating the wavelength-variable DBR semiconductor laser 34 thus configured is described briefly below. First, n-type AlGaAs is grown epitaxially on an n-type GaAs substrate using a MOCVD device, after which the active region of the AlGaAs is formed. A p-type AlGaAs is deposited as a cladding layer, and a rib optical waveguide is formed using photolithography. Next, electron beam lithography is used to form a first-order grating (100 nm period) on the optical waveguide. Silicon ions are implanted into the DBR region, where the grating has been formed, and into the phase control change region so as to form a passive optical waveguide. Next, a second crystal growth is performed to deposit p-type AlGaAs as a cladding layer, and then lastly, electrodes for supplying current are formed on the n- and p-sides.

The three-electrode AlGaAs wavelength-variable DBR semiconductor laser has a threshold value of 25 mA, and obtains a 50 mW output with respect to a supply current (operating current) of 150 mA to the active region. FIG. 15 shows the wavelength variability properties when current is supplied to the DBR region. The current supplied to the DBR region (DBR current) was changed to thermally change the refractive index of the DBR region and thereby achieve wavelength variability. The emitted semiconductor laser beam was guided into a light spectrum analyzer and the oscillation wavelength was measured. A stepwise wavelength variation width of 2 nm like that shown in FIG. 15 was obtained with respect to the operation current of 100 mA and a phase current of 0 mA. The oscillation wavelength was maintained in single longitudinal mode even during tuning.

Next, the phase current was set to 20 mA and the wavelength variability properties when the DBR current is similarly changed were measured. Furthermore, the phase current also was set to 40 mA, and the wavelength variability properties when the DBR current is similarly changed were measured. Based on the results that were obtained, the results of the DBR current values experiencing mode hopping (the current values at the points A serving as steps) were plotted in FIG. 16. According to this map, the DBR current (Idbr) and the phase current (Iph) can be controlled and held at a current ratio relationship of Idbr/Iph=0.5, so that it is possible to achieve continuous wavelength variability properties like those shown in FIG. 17.

As described above, the wavelength variability properties are important for wavelength-variable DBR and DFB semiconductor lasers. The factors that are essential for the wavelength-variability properties are: i) single longitudinal mode properties; ii) wavelength variability replicability; and iii) the current ratio Idbr/Iph required for continuous wavelength variability. Single longitudinal mode properties are the most critical aspect for optical communication applications and second harmonic generation, and in second harmonic generation; for example, a large drop in conversion efficiency occurs if the longitudinal mode becomes multimode. Wavelength variability replicability is essential for controlling the wavelength, and as shown in FIG. 15, it has the property of monotonically increasing. In addition, excellent replicability of the wavelength variability properties is essential. The current ratio Idbr/Iph required for continuous wavelength variability must be measured for each semiconductor laser, as there is individual variation between semiconductor lasers.

A light spectrum analyzer or the like was employed conventionally to make measurements when these properties were evaluated, and this required a considerable amount of effort. Accordingly, the simplification of the inspection process was an important issue from the standpoint of mass-producing, for example, wavelength-variable DBR semiconductor lasers.

SUMMARY OF THE INVENTION

Therefore, the present invention was intended in order to solve the foregoing problems of the prior art, and it is an object thereof to provide a device for inspecting a wavelength-variable semiconductor laser having a simple structure that is both fast and accurate, a convenient method of inspecting a wavelength-variable semiconductor laser, and a method of inspecting a coherent light source.

To achieve the foregoing object, a first configuration of a device for inspecting a wavelength-variable semiconductor laser according to the present invention is characterized as a device for inspecting a wavelength-variable semiconductor laser having at least an active region, a phase control region, and a distributed Bragg reflector (DBR) region, and is provided with a power source for supplying current to the active region, the phase control region, and the DBR region, a photo-detector for detecting an output intensity of laser beam emitted from the wavelength-variable semiconductor laser, and a transmission-type wavelength-selection element that can be inserted into a light path from the wavelength-variable semiconductor laser to the photo-detector.

In the first configuration of a device for inspecting a wavelength-variable semiconductor laser according to the present invention, it is preferable that with the transmission type wavelength-selection element inserted into the light path from the wavelength-variable semiconductor laser to the photo-detector, at least one of a phase current that is supplied to the phase control region and a DBR current that is supplied to the DBR region is changed with respect to a predetermined active current that is supplied to the active region, and the output intensity of the laser beam after the laser beam has passed through the transmission-type wavelength-selection element is detected by the photo-detector.

A first method for inspecting a wavelength-variable semiconductor laser according to the present invention is characterized as a method for inspecting a wavelength-variable semiconductor laser using the inspection device according to the first configuration of the present invention, wherein in a state where the transmission-type wavelength-selection element is not inserted into the light path from the wavelength-variable semiconductor laser to the photo-detector, the active current that is supplied to the active region is changed, the output intensity of laser beam emitted from the wavelength-variable semiconductor laser is detected by the photo-detector, and the relationship between the active current and the output intensity is determined.

A second method for inspecting a wavelength-variable semiconductor laser according to the present invention is characterized as a method for inspecting a wavelength-variable semiconductor laser using the inspection device according to the first configuration of the present invention, wherein in a state where a constant active current is supplied to the active region and the transmission-type wavelength-selection element is inserted into the light path from the wavelength-variable semiconductor laser to the photo-detector, the DBR current that is supplied to the DBR region is changed, the output intensity of the laser beam after the laser beam has passed through the transmission type wavelength-selection element is detected by the photo-detector, and the DBR current corresponding to a desirable wavelength of the wavelength-variable semiconductor laser is determined.

In the second method for inspecting a wavelength-variable semiconductor laser according to the present invention, it is preferable that the desirable wavelength of the wavelength-variable semiconductor laser is a wavelength where the output intensity of the laser beam is largest after the laser beam has passed through the transmission-type wavelength-selection element.

A third method for inspecting a wavelength-variable semiconductor laser according to the present invention is characterized as a method for inspecting a wavelength-variable semiconductor laser using the inspection device according to the first configuration of the present invention, wherein in a state where a constant active current is supplied to the active region and the transmission-type wavelength-selection element is inserted into the light path from the wavelength-variable semiconductor laser to the photo-detector, the phase current that is supplied to the phase control region and the DBR current that is supplied to the DBR region are each changed independently, the output intensity of the laser beam after the laser beam has passed through the transmission-type wavelength-selection element is detected by the photo-detector, and the phase current and the DBR current corresponding to points of change in the output intensity are determined.

In the third method of inspecting a wavelength-variable semiconductor laser according to the present invention, it is preferable that a current ratio of the DBR current to the phase current is calculated from the DBR current and the phase current corresponding to the points of change in the output intensity. Also, in this case, it is preferable that the current ratio of the DBR current to the phase current is calculated and the DBR current and the phase current are kept at this current ratio, so as to change an oscillation wavelength of the wavelength-variable semiconductor laser continuously.

In the third method for inspecting a wavelength-variable semiconductor laser according to the present invention, it is preferable that a current ratio $\Delta Idbr/\Delta Iph$ of the DBR current to the phase current is calculated from a DBR current difference $\Delta Idbr$ corresponding to the points of change in the output intensity that are obtained when the DBR current is changed, and a phase current difference $\Delta Iph$ corresponding to the points of change in the output intensity that are obtained when the phase current is changed. Also, in this case, it is preferable that the current ratio of the DBR current to the phase current is calculated and the DBR current and the phase current are kept at this current ratio, so as to change an oscillation wavelength of the wavelength-variable semiconductor laser continuously.

A fourth method for inspecting a wavelength-variable semiconductor laser according to the present invention is characterized as a method for inspecting a wavelength-variable semiconductor laser having at least an active region, a phase control region, and a distributed Bragg reflector (DBR) region, the method including supplying a predetermined active current to the active region and detecting an obtained output intensity of a laser beam by a photo-detector, finding a DBR current difference $\Delta Idbr$ corresponding to the points of change in the output intensity of the laser beam that are obtained when a DBR current supplied to the DBR region is changed, and a phase current difference $\Delta Iph$ corresponding to the points of change in the output intensity that are obtained when a phase current supplied to the phase control region is changed, and calculating a current ratio $\Delta Idbr/\Delta Iph$ of the DBR current difference $\Delta Idbr$ to the phase current difference $\Delta Iph$.

In the fourth method of inspecting a wavelength-variable semiconductor laser according to the present invention, it is preferable that the points of change in the output intensity that are obtained when the phase current is changed and the points of change in the output intensity that are obtained when the DBR current is changed are the points of change where a reduction in output intensity changes to an increase in output intensity.

In the fourth method for inspecting a wavelength-variable semiconductor laser according to the present invention, it is preferable that by keeping the DBR current and the phase current at the current ratio $\Delta Idbr/\Delta Iph$, an oscillation wavelength of the wavelength-variable semiconductor laser is changed continuously.

A second configuration of a device for inspecting a wavelength-variable semiconductor laser according to the present invention is characterized as a device for inspecting a wavelength-variable semiconductor laser having at least an active region, a phase control region, and a distributed Bragg reflector (DBR) region, and is provided with a power source for supplying current to the active region, the phase control region, and the DBR region, a photo-detector for detecting an output intensity of laser beam emitted from the wavelength-variable semiconductor laser, and a second harmonic generation (SHG) element that can be inserted into a light path from the wavelength-variable semiconductor laser to the photo-detector.

In the second configuration of a device for inspecting a wavelength-variable semiconductor laser according to the present invention, it is preferable that, with the SHG element inserted into the light path from the wavelength-variable semiconductor laser to the photo-detector, at least one of a phase current that is supplied to the phase control region and a DBR current that is supplied to the DBR region is changed with respect to a predetermined active current that is supplied to the active region, and the output intensity of the harmonic light that has been wavelength converted by the SHG element is detected by the photo-detector.

A fifth method for inspecting a wavelength-variable semiconductor laser according to the present invention is characterized as a method for inspecting a wavelength-variable semiconductor laser using the inspection device of the second configuration according to the present invention, wherein in a state where the SHG element is not inserted into the light path from the wavelength-variable semiconductor laser to the photo-detector, an active current that is supplied to the active region is changed, the output intensity of laser beam emitted from the wavelength-variable semiconductor laser is detected by the photo-detector, and the relationship between the active current and the output intensity is determined.

A sixth method for inspecting a wavelength-variable semiconductor laser according to the present invention is characterized as a method for inspecting a wavelength-variable semiconductor laser using the inspection device according to the second configuration of the present invention, wherein in a state where a constant active current is supplied to the active region and the SHG element is inserted into the light path from the wavelength-variable semiconductor laser to the photo-detector, the DBR current that is supplied to the DBR region is changed, the output intensity of the harmonic light that is wavelength converted by the SHG element is detected by the photo-detector, and the DBR current corresponding to a desirable wavelength of the wavelength-variable semiconductor laser is determined.

In the sixth method for inspecting a wavelength-variable semiconductor laser according to the present invention, it is preferable that the desirable wavelength of the wavelength-variable semiconductor laser is a wavelength where the output intensity of the harmonic light that is wavelength converted by the SHG element is largest.

A seventh method for inspecting a wavelength-variable semiconductor laser according to the present invention is characterized as a method for inspecting a wavelength-variable semiconductor laser using the inspection device according to the second configuration of the present invention, wherein in a state where a constant active current is supplied to the active region and the SHG element is inserted into the light path from the wavelength-variable semiconductor laser to the photo-detector, the phase current that is supplied to the phase control region and the DBR current that is supplied to the DBR region are each changed independently, the output intensity of the harmonic light that is wavelength converted by the SHG element is detected by the photo-detector, and the phase current and the DBR current corresponding to points of change in the output intensity are determined.

In the seventh method for inspecting a wavelength-variable semiconductor laser according to the present invention, it is preferable that a current ratio of the phase current to the DBR current is calculated from the phase current and the DBR current corresponding to the points of change in the output intensity. Also, in this case, it is preferable that the current ratio of the DBR current to the phase current is calculated and the DBR current and the phase current are kept at the current ratio, so as to change an oscillation wavelength of the wavelength-variable semiconductor laser continuously.

In the seventh method fore inspecting a wavelength-variable semiconductor laser according to the present invention, it is preferable that a current ratio $\Delta Idbr/\Delta Iph$ of the DBR current to the phase current is calculated from a DBR current difference $\Delta Idbr$ corresponding to the points of change in the output intensity that are obtained when the DBR current is changed, and a phase current difference $\Delta Iph$ corresponding to the points of change in the output intensity that are obtained when the phase current is changed. Also, in this case, it is preferable that the current ratio of the DBR current to the phase current is calculated and the DBR current and the phase current are kept at the current ratio, so as to change an oscillation wavelength of the wavelength-variable semiconductor laser continuously.

A first method for inspecting a coherent light source according to the present invention is characterized as a method for inspecting a coherent light source provided with a wavelength-variable semiconductor laser having at least an active region, a phase control region, and a distributed Bragg reflector (DBR) region, and a second harmonic generation (SHG) element, wherein the method includes supplying a constant active current to the active region, changing a DBR current that is supplied to the DBR region, detecting an output intensity of harmonic light that is wavelength converted by the SHG element by a photo-detector, and finding the DBR current corresponding to a desirable wavelength of the wavelength-variable semiconductor laser.

In the first method for inspecting a coherent light source according to the present invention, it is preferable that the desirable wavelength of the wavelength-variable semiconductor laser is a wavelength where the output intensity of the harmonic light that is wavelength converted by the SHG element is largest.

A second method for inspecting a coherent light source according to the present invention is characterized as a method for inspecting a coherent light source provided with a wavelength-variable semiconductor laser having at least an active region, a phase control region, and a distributed Bragg reflector (DBR) region, and a second harmonic generation (SHG) element, wherein the method includes independently changing a phase current that is supplied to the phase control region and a DBR current that is supplied to the DBR region, detecting an output intensity of harmonic light that is wavelength converted by the SHG element by a photo-detector, and finding the phase current and the DBR current corresponding to the points of change in the output intensity.

In the second method for inspecting a coherent light source according to the present invention, it is preferable that a current ratio of the DBR current to the phase current is calculated from the DBR current and the phase current corresponding to the points of change in the output intensity. Also, in this case, it is preferable that the current ratio of the DBR current to the phase current is calculated and the DBR current and the phase current are kept at the current ratio, so as to change an oscillation wavelength of the wavelength-variable semiconductor laser continuously.

In the second method for inspecting a coherent light source according to the present invention, it is preferable that a current ratio ΔIdbr/ΔIph of the DBR current to the phase current is calculated from a DBR current difference ΔIdbr corresponding to the points of change in the output intensity that are obtained when the DBR current is changed, and a phase current difference ΔIph corresponding to the points of change in the output intensity that are obtained when the phase current is changed. Also, in this case, it is preferable that the current ratio of the DBR current to the phase current is calculated and the DBR current and the phase current are kept at the current ratio, so as to change an oscillation wavelength of the wavelength-variable semiconductor laser continuously.

DESCRIPTION OF THE PREFERRED EMBODIMENTS

Hereinafter, the present invention will be described in further detail using embodiments thereof.

Embodiment 1

Figure 1:
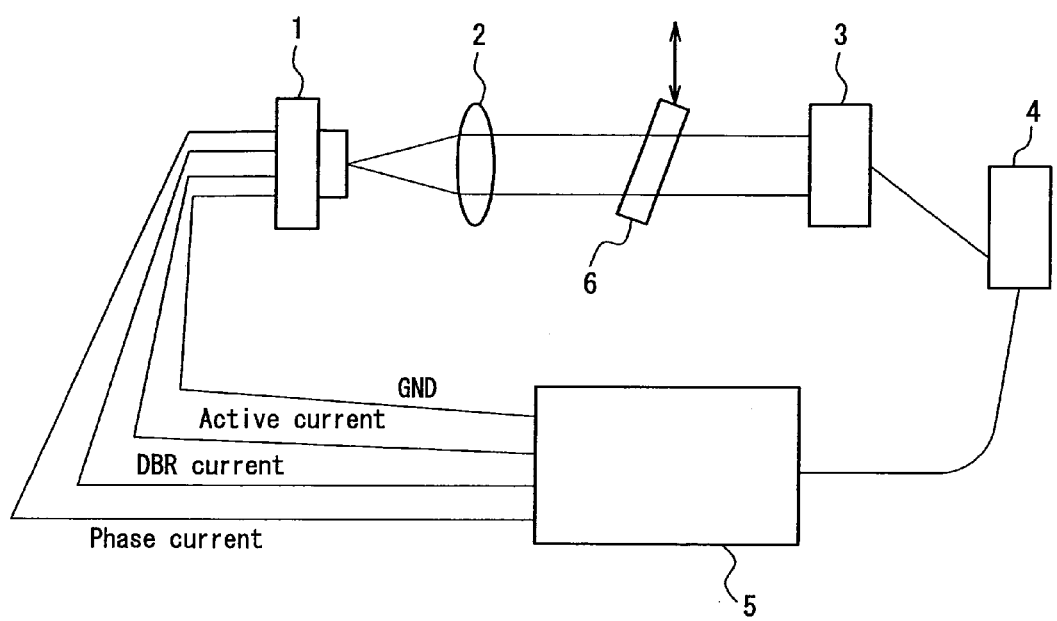
FIG. 1 is a diagram schematically showing the configuration of a device for inspecting a wavelength-variable DBR semiconductor laser according to Embodiment 1 of the present invention.

FIG. 1 schematically shows the configuration of a device for inspecting a DBR semiconductor laser having a wavelength-varying function (hereinafter, referred to as "wavelength-variable DBR semiconductor laser") according to Embodiment 1 of the present invention.

As shown in FIG. 1, a laser beam that is emitted from a wavelength-variable DBR semiconductor laser 1 is collimated by a lens 2 and guided to a photo-detector 3 for detecting the output intensity of the laser beam. A photo-detector having a band of up to about the MHz range can be employed as the photo-detector 3. Adopting a photo-detector that has an even faster response speed for the photo-detector 3 can increase light detection speeds, but it also reduces the light-receiving area. Signal light that is detected by the photo-detector 3 is converted into a digital signal by an A/D converter 4 and then stored in a memory of a control circuit 5. A 12-bit microcomputer can be used as a control microcomputer. The inspection device is provided with a transmission type wavelength-selection element 6 that can be inserted into the light path from the wavelength-variable DBR semiconductor laser 1 to the photo-detector 3.

In this embodiment, a dielectric multilayer film formed on a quartz glass substrate is employed as the transmission type wavelength-selection element 6. Here, the dielectric multilayer film has a layered structure of $TiO_2$ and $SiO_2$. By adopting a transparent type wavelength-selection element 6 made of a dielectric multilayer film, the transmission peak wavelength can be changed by changing the angle of the transmission type wavelength-selection element 6 with respect to the optical axis of the laser beam. In this case, the transmission peak wavelength is shifted to the short wavelength side when the angle of the transmission type wavelength-selection element 6 with respect to the optical axis of the laser beam is increased.

The angle of the transmission type wavelength-selection element 6 employed in this embodiment with respect to the optical axis of the laser beam was held constant and the transmission spectrum was evaluated. In this embodiment, three types (samples A, B, and C) of transmission type wavelength-selection elements 6 are employed, and their maximum transmissivity (%) and full width at half maximum (nm) where their transmissivity is half are respectively 50% and 0.15 nm for sample A, 70% and 0.3 nm for sample B, and 90% and 0.6 nm for sample C.

The wavelength-variable DBR semiconductor laser 1 has three regions. These are an active region, a phase control region, and a distributed Bragg reflector (DBR) region. The active region is the region where gain is generated. A diffraction grating is formed in the DBR region, and only light of a certain wavelength determined by the period of this diffraction grating is reflected. For that reason, when current is supplied to the active region from the power source within the control circuit 5 (hereinafter, referred to as the "active current"), laser oscillation occurs between the end face on the active region side and the DBR region. Also, when current is supplied to the DBR region and the phase control region from the power source within the control circuit 5 (hereinafter, respectively referred to as the "DBR current" and the "phase current"), the temperature rises due to internal resistance and the refractive index is changed. Thus, in the DBR region, the wavelength of the light that is reflected is changed, and in the phase control region, the phase state of the resonator that is constituted by the emission end surface on the active region side and the DBR region is changed.

Figure 15:
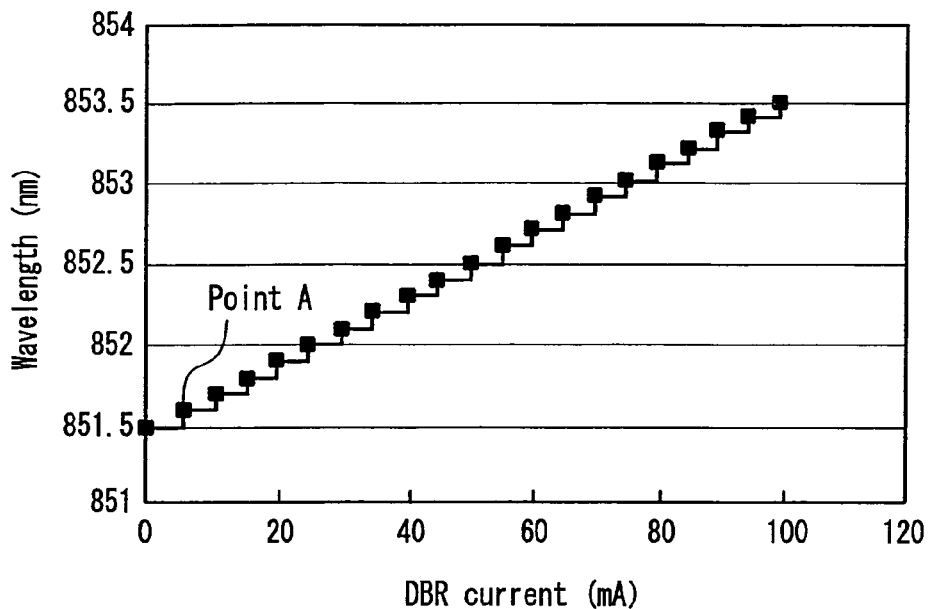
FIG. 15 is a diagram showing the wavelength variability properties of a wavelength-variable DBR semiconductor laser according to the prior art when the DBR current is changed.

As mentioned in the prior art section, when the active current is held constant and the DBR current is changed, stepwise wavelength variability properties are obtained. In addition, by further changing the phase current and once again changing the DBR current, wavelength variability properties are obtained, and when the current values (the points A in FIG. 15 of the prior art) serving as steps (that is, the points of change in the output intensity) are plotted, the map shown in FIG. 16 of the prior art is obtained. From this map, a current ratio Idbr/Iph=0.5 of the DBR current (Idbr) to the phase current (Iph) is calculated, and by maintaining this relationship while controlling the DBR current (Idbr) and the phase current (Iph), it is possible to obtain continuous wavelength variability properties such as those illustrated in FIG. 17 of the prior art.

An inspection method employing the device for inspecting wavelength-variable DBR semiconductor lasers shown in FIG. 1 will be described.

1) Active Current—Laser Output Properties

Figure 2:
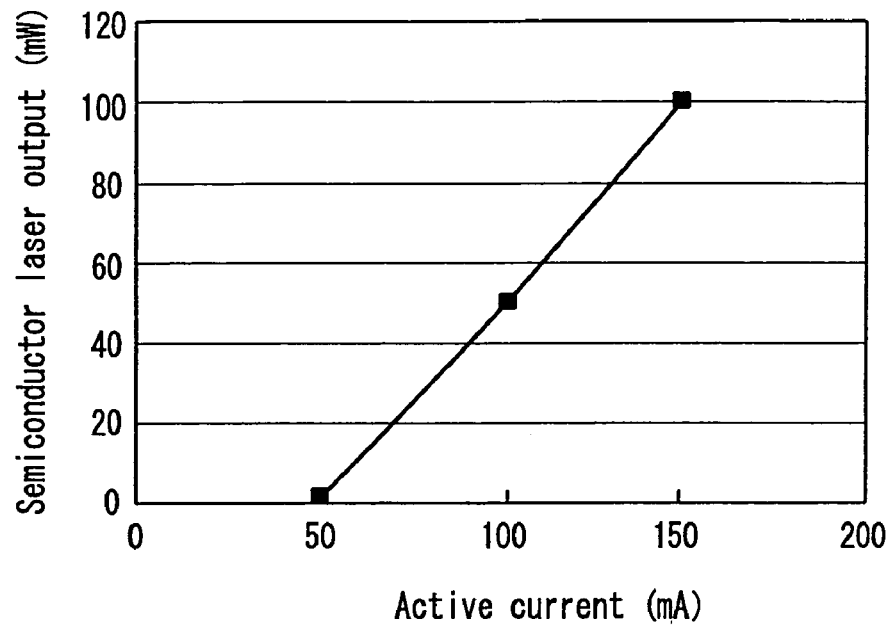
FIG. 2 is a diagram showing the relationship between the active current and the output intensity of the wavelength-variable DBR semiconductor laser according to Embodiment 1 of the present invention.

First, in a state where the transmission type wavelength-selection element 6 is not inserted into the light path from the wavelength-variable DBR semiconductor laser 1 to the photo-detector 3, the active current is changed and the output intensity of the laser beam emitted from the wavelength-variable DBR semiconductor laser 1 is detected by the photo-detector 3. In a state when there is no transmission type wavelength-selection element 6, the active current can be supplied to the active region to obtain active current—laser output properties like those shown in FIG. 2.

2) Detecting the Wavelength of the Wavelength-Variable DBR Semiconductor Laser

Figure 3:
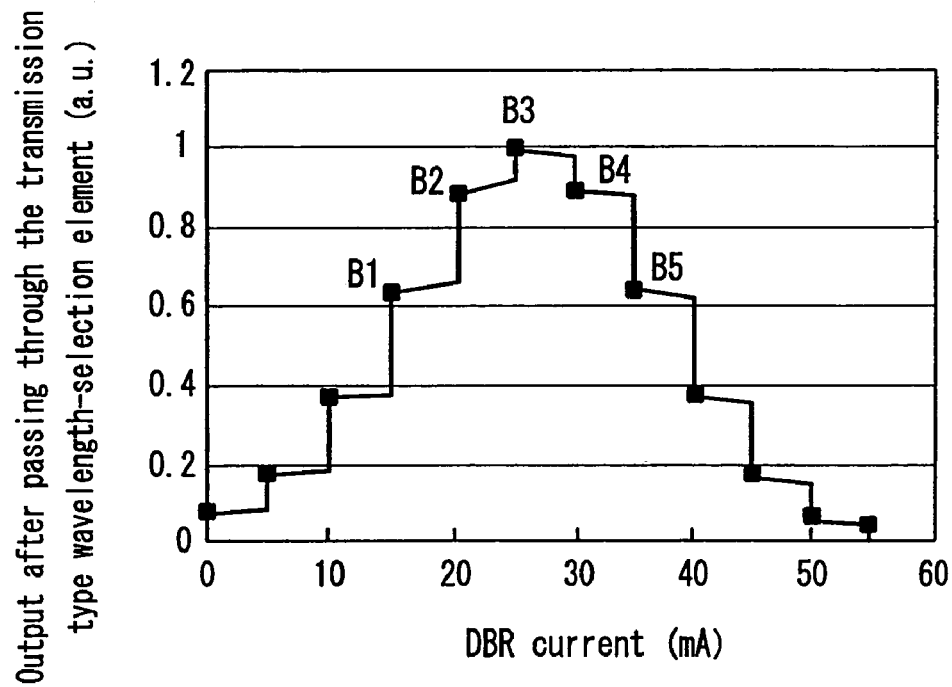
FIG. 3 is a diagram showing the relationship between the DBR current and the output after it has passed through the transmission type wavelength-selection element according to Embodiment 1 of the present invention.

The output properties of the wavelength-variable DBR semiconductor laser 1 are detected by the photo-detector 3 in a state where the transmission type wavelength-selection element 6 is inserted into the light path from the wavelength-variable DBR semiconductor laser 1 to the photo-detector 3, the active current is set to 150 mA (laser output 100 mW) and the phase current is set to 0 mA, and the DBR current is changed. It should be noted that by adjusting the angle of the transmission wavelength-selection element 6 (sample C: maximum transmissivity: 90%, full width at half maximum: 0.6 nm) with respect to the optical axis of the laser beam that is emitted from the wavelength-variable DBR semiconductor laser 1, the transmission peak wavelength is set to 820 nm. In this embodiment, the desirable wavelength is set to 820±0.5 nm. When the oscillation wavelength of the wavelength-variable DBR semiconductor laser 1 becomes 820 nm and the DBR current is changed from 0 mA to 50 mA, then the signal light that is detected after it has passed through the transmission type wavelength-selection element 6 (the output intensity of the laser beam) is largest. The oscillation wavelength of the wavelength-variable DBR semiconductor laser 1 employed in this embodiment changes from 819.5 nm when the DBR current is 0 mA to 820.5 nm when the DBR current is 50 mA. The signal light that is detected at this time by the photo-detector 3 (the output intensity of the laser beam prior to A/D conversion) is shown in FIG. 3. In FIG. 3, the vertical axis indicates the relative intensity. As shown in FIG. 3, the maximum output intensity is detected when the DBR current is 25 mA. Thus, it is clear that in this embodiment, the DBR current corresponding to the desirable wavelength of the wavelength-variable DBR semiconductor laser 1 is 25 mA.

3) Detecting the Current Ratio Idbr/Iph

Figure 4:
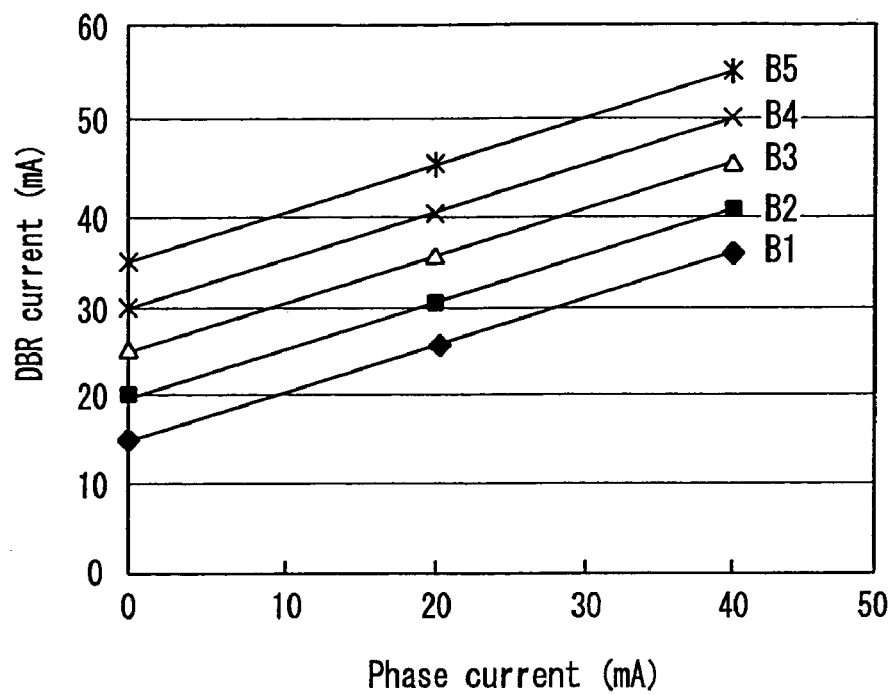
FIG. 4 is a diagram showing the relationship between the phase current and the DBR current corresponding to the points of change in the output according to Embodiment 1 of the present invention.

The points of change (the current values B1 to B5 serving as steps) in the output intensity of the laser beam after the laser beam has passed through the transmission type wavelength-selection element 6 when the DBR current is changed, and which are shown in FIG. 3, are the mode hop points of the oscillation wavelength. That is, these points of change in the output intensity correspond to the mode hop points (for example, points A) shown in FIG. 15 of the prior art. Next, the output intensity of the laser beam is detected by the photo-detector 3 after it has passed through the transmission type wavelength-selection element 6 when the phase current is set to 20 mA and the DBR current is similarly changed. By increasing the phase current, the refractive index in the optical waveguide, that is, the phase state is changed, so that the points of change (B1 to B5) of output intensity are shifted. Further, the output intensity of the laser beam was detected by the photo-detector 3 after it passes through the transmission type wavelength-selection element 6 when the phase current is set to 40 mA and the DBR current is similarly changed, to find the points of change in the output intensity (B1 to B5). FIG. 4 shows the DBR current and the phase current corresponding to the points of the change in the output intensity (B1 to B5).

Figure 16:
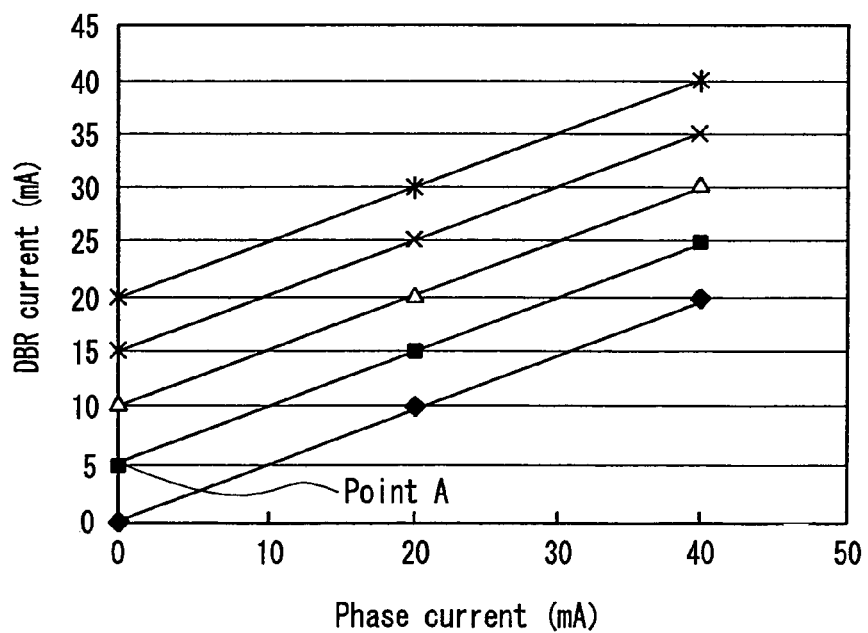
FIG. 16 is a diagram showing the relationship between the phase current and the DBR current corresponding to the mode hop points according to the prior art.
Figure 17:
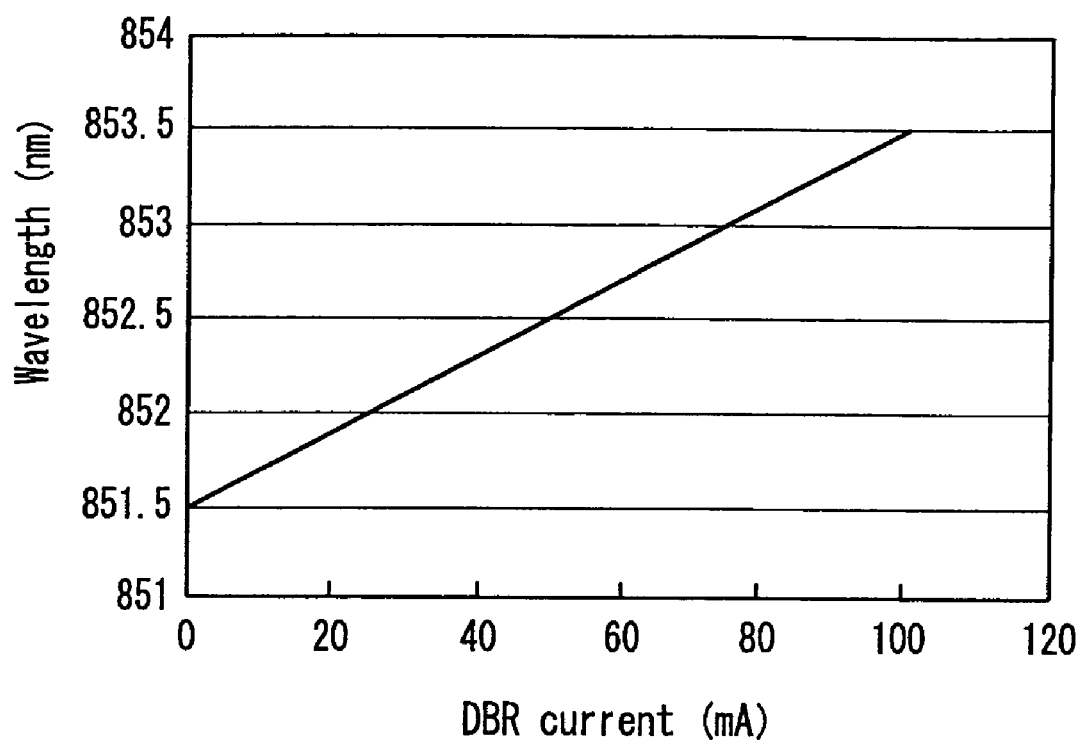
FIG. 17 is a diagram showing the continuous wavelength variability properties of a wavelength-variable DBR semiconductor laser according to the prior art.

The map of FIG. 4 corresponds to that of FIG. 16, which is described in the prior art section. By calculating the current ratio Idbr/Iph of the DBR current (Idbr) to the phase current (Iph) from this map and supplying the DBR current (Idbr) and the phase current (Iph) to the DBR region and the phase control region, respectively, at this current ratio, the emission wavelength of the wavelength-variable DBR semiconductor laser 1 can be changed continuously. That is, it is possible to achieve continuous wavelength variability. In the present embodiment, Idbr/Iph=0.5 was calculated from FIG. 4, and continuous wavelength variability was achieved by keeping the DBR current (Idbr) and the phase current (Iph) at this current ratio.

Data processing in which the control circuit (microcomputer) 5 is employed will be described below. In this embodiment, a 12-bit microcomputer is adopted for the control microcomputer, and thus the current that is supplied to each region can be divided into 4096 stages, from 0X000 to 0XFFF. Here, 0X is a hexadecimal number. Also, in this embodiment, the maximum value of the phase current and the DBR current is set to approximately 128 mA. That is, 0X020 is equivalent to 1 mA. Further, in this embodiment, the maximum value of the active current is set to approximately 256 mA. That is, 0X010 is equivalent to 1 mA.

First Method (Calculation from Map)

Here, the active current has been set to 0X640 (equivalent to 100 mA, 50 mW). First, the phase current is set to 0X000 (0 mA), and with the phase current held constant, the DBR current is changed in increments of 0X010 (0.5 mA) from 0X010 (0.5 mA) to 0X700 (56 mA). Then, the signal light detected by the photo-detector 3 is converted into a digital signal by the A/D converter 4, and data Pd(1) to Pd(112) are stored in a memory of the control circuit 5. Next, the phase current is set to 0X280 (20 mA) and then 0X500 (40 mA), and the DBR current is similarly changed for each phase current and the respective data Pd(1) to Pd(112) are stored in the memory of the control circuit 5.

Using the data stored in the memory, the following operation is performed.

1) The DBR current Idbrmax (N) corresponding to Pd(N), the largest value of Pd(1) to Pd(112), is determined. As a result, it was found that the DBR current corresponding to the desirable wavelength of the wavelength-variable DBR semiconductor laser 1 is 0X320 (25 mA).

2) The DBR current Idbr δ(N), where Pd(N+1)−Pd(N) >δP, that is, the points of change of output intensity of the laser beam, are determined. Here, δP is dependent on the wavelength selection properties of the transmission type wavelength-selection element 6 that is used. In this embodiment, δP is set to 0.05 Pd(N), which is equivalent to 5% of the maximum output Pd(N).

By plotting these data, a map equivalent to that of FIG. 4 is obtained. From this map, the average value of the current ratio Idbr/Iph of the DBR current (Idbr) to the phase current (Iph) is determined, and by supplying the DBR current (Idbr) and the phase current (Iph) to the DBR region and the phase control region, respectively, at this current ratio, continuous wavelength variability can be attained. In this embodiment, Idbr/Iph=0.5.

In this embodiment, the wavelength variability properties and the single mode properties, for example, of the wavelength-variable DBR semiconductor laser 1 can be investigated. As can be understood from FIG. 3, when the DBR current is below 0X320 (25 mA), where the signal light (output intensity of the laser beam) that is detected by the photo-detector 3 is the largest, then the signal that is obtained increases monotonically, and when the DBR current is greater than 0X320 (25 mA), the signal that is obtained decreases monotonically. Also, the DBR current difference corresponding to the points of change in the output intensity of the laser beam, where Pd(N+1)−Pd(N) >δP, is substantially constant Properties like those shown in FIG. 3 are not obtained if the measured wavelength variability properties of the wavelength-variable DBR semiconductor laser 1: i) do not monotonically increase; ii) the longitudinal mode becomes multimode; and iii) the mode hop points (points of change in the output intensity) during tuning are unstable.

In this embodiment, by 1) evaluating the monotonic increase properties and the monotonic decrease properties before and after 0X320 (25 mA), or by 2) evaluating a spacing value between the points of change in output intensity that has significantly departed (for example, by 30% or more) from the average spacing value, it was possible to investigate the wavelength variability properties and the single mode properties, for example, of the wavelength-variable DBR semiconductor laser 1.

The inspection device and the inspection method of this embodiment are characterized in that the device is inexpensive and the inspection speed is fast. With a light spectrum analyzer such as that used in the prior art, the device was costly and both the scan speed and the uptake of data were slow, ordinarily requiring several seconds from the trigger to the output of data. On the other hand, with the configuration of this embodiment, the inspection time is dependent on the supply speed when current is supplied to the wavelength-variable DBR semiconductor laser 1 and the response speed of the photo-detector 3, and inspection on the order of μsec (microsecond) to msec (millisecond) or less is possible. Indeed, inspection on the order of nsec (nanosecond) to μsec (microsecond) or less is possible by employing a photo-detector 3 with a high response speed.

Moreover, the transmission type wavelength-selection element is characterized in that its wavelength selection properties can be designed freely by giving the element a multilayer film structure. In addition, by giving the element a full width at half maximum of about 0.6 nm like in this embodiment, wavelength variability properties in a wavelength variability region of about 1 nm can be evaluated. Consequently, this embodiment allows for the simultaneous measurement of the wavelength variability properties, the DBR current corresponding to the desirable wavelength, and the current ratio Idbr/Iph=0.5 required for continuous wavelength variability. Moreover, with this embodiment, by designing an about 1 nm full width at half maximum of the wavelength selection properties, the wavelength variability properties in a wavelength variability region of about 2 nm can be evaluated. However, when the wavelength variability width is increased, the difference in the signal at the points of change in the output intensity detected by the photo-detector is decreased, so that the wavelength variability width must be set to a wavelength selection width that matches the detection and analysis capabilities.

Embodiment 2

Second Method (Calculation from Slope Across a Micro Region)

In a wavelength-variable DBR semiconductor laser, if the phase current is changed within a range of about ±10 mA, which is that of the mode hop points, then mode hop (change in output intensity) does not occur within that range. Consequently, if the dependency of Idbr(max) on the phase current in this region is measured, then the current ratio Idbr/Iph can be found more easily. In this embodiment, the sample A (maximum transmissivity: 50%, full width at half maximum: 0.15 nm) is employed as the transmission type wavelength-selection element 6 of the configuration shown in FIG. 1.

Here, the active current is set to 0X640 (equivalent to 100 mA, 50 mW). First, the phase current is set to 0X000(0 mA), and with the phase current constant, the DBR current is changed in increments of 0X010 (0.5 mA) from 0X010 (0.5 mA) to 0X700 (56 mA). Then, the signal light that is detected by the photo-detector 3 is converted into a digital signal by the A/D converter 4, and data Pd1(1) to Pd1(112) are stored in a memory of the control circuit 5. Next, the phase current is raised in increments of 0X010 (0.5 mA) from 0X000 (0 mA) to 0X500 (40 mA), and for each phase current, the DBR current is changed in increments of 0X010 (0.5 mA) from 0X010 (0.5 mA) to 0X700 (56 mA). Then, the signal light that is detected by the photo-detector 3 is converted into a digital signal by the A/D converter 4, and data Pdn(1) to Pdn(112) are stored in a memory of the control circuit 5. At this time, the phase current and the DBR current (Iph0, Idbr0) each corresponding to Pd(N), the largest value of Pd1(1) to Pdn(112) stored in the memory, are determined. In this embodiment, Iph0=20 mA and Idbr0=25 mA were obtained. Here, the phase current when the signal light is largest is determined in order to increase the amount of change between the points of change in the output intensity from Pdn(1) to Pdn(112), which are obtained when the DBR current is changed.

A method for inspecting will be described.

First, the phase current is set to 0X280 (20 mA), and with the phase current held constant, the DBR current is changed in increments of 0X010 (0.5 mA) from 0X010 (0.5 mA) to 0X700 (56 mA). Then, the signal light detected by the photo-detector 3 is converted into a digital signal by the A/D converter 4, and data Pd1(1) to Pd1(112) are stored in the memory of the control circuit 5. Next, the phase current is set to 0X1E0 (15 mA), which is a reduction of 5 mA, and held constant, and the DBR current is similarly changed in increments of 0X010 (0.5 mA) from 0X010 (0.5 mA) to 0X700 (56 mA). Then, the signal light that is detected by the photo-detector 3 is converted into a digital signal by the A/D converter 4, and data Pd2(1) to Pd2(112) are stored in a memory of the control circuit 5. Then, the phase current is set to 0X320 (25 mA), which is an increase of 5 mA, and with the phase current constant, the DBR current is similarly changed in increments of 0X010 (0.5 mA) from 0X010 (0.5 mA) to 0X700 (56 mA). Then, the signal light that is detected by the photo-detector 3 is converted into a digital signal by the A/D converter 4, and data Pd3(1) to Pd3(112) are stored in a memory of the control circuit 5.

Figure 5:
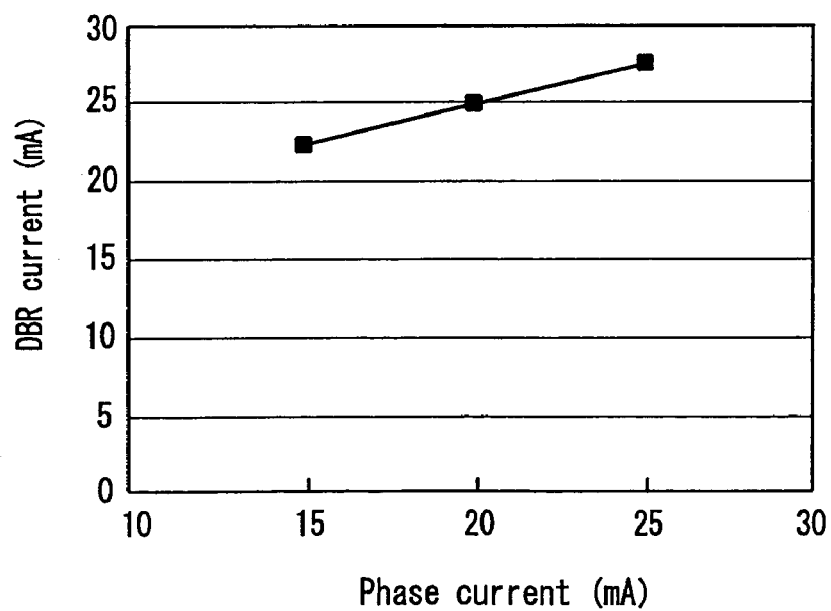
FIG. 5 is a diagram showing the relationship between the phase current and the DBR current corresponding to the points of change in the output according to Embodiment 2 of the present invention.

Using the data stored in the memory, the DBR current where Pd1(N+1)−Pd1(N), Pd2(N+1)−Pd2(N), and Pd3(N+1)−Pd3(N) are largest, that is, the DBR current corresponding to the points of change of the output intensity of the laser beam, are determined for each phase current (however, negative values are disregarded in this embodiment). FIG. 5 shows the results. In FIG. 5, the horizontal axis is the phase current with respect to the points of change in output intensity, and the vertical axis is the DBR current. The slope of the line joining the three points is the current ratio Idbr/Iph, and here Idbr/Iph=0.5.

In the configuration of this embodiment, like in Embodiment 1, the inspection time is dependent on the supply speed when current is supplied to the wavelength-variable DBR semiconductor laser 1 and on the response speed of the photo-detector 3, and inspection on the order of msec (millisecond) or less is possible.

Also, the wavelength selection width in this embodiment is extremely small with its full width at half maximum being 0.15 nm. Additionally, the ideal points of the phase current are detected. By narrowing the wavelength selection width, the difference in the signals detected by the photo-detector at the points of change in output intensity is increased, and the detection accuracy of the signal difference Pd(N+1)−Pd(N) is improved. Accordingly, like in this embodiment, the DBR current (Idbr) where the signal difference Pd(N+1)−Pd(N) is largest can be detected and the current ratio Idbr/Iph can be calculated easily, and thus a further reduction in inspection times can be achieved.

Embodiment 3

In this embodiment, a method of calculating the current ratio Idbr/Iph using the spacing between the points of change in the output intensity of the laser beam will be described. In this method, the sample B, which has a transmission spectrum with a full width at half maximum of 0.3 nm, is employed as the transmission type wavelength-selection element 6.

Here, the active current is set to 0X640 (equivalent to 100 mA, 50 mW). First, the phase current is set to 0X000(0 mA), and with the phase current constant, the DBR current is changed in increments of 0X010 (0.5 mA) from 0X010 (0.5 mA) to 0X700 (56 mA). Then, signal light that is detected by the photo-detector 3 is converted into a digital signal by the A/D converter 4, and data Pd(1) to Pd(112) are stored in a memory of the control circuit 5. Next, the DBR current is held at the Idbr (25 mA) corresponding to Pd(N), which is the largest value of Pd(1) to Pd(112), and the phase current is changed in increments of 0X010 (0.5 mA) from 0X000 (0 mA) to 0X700 (56 mA). Then, the signal light that is detected by the photo-detector 3 is converted into a digital signal by the A/D converter 4, and data Pi(1) to Pi(112) are stored in a memory of the control circuit 5.

Figure 6A:
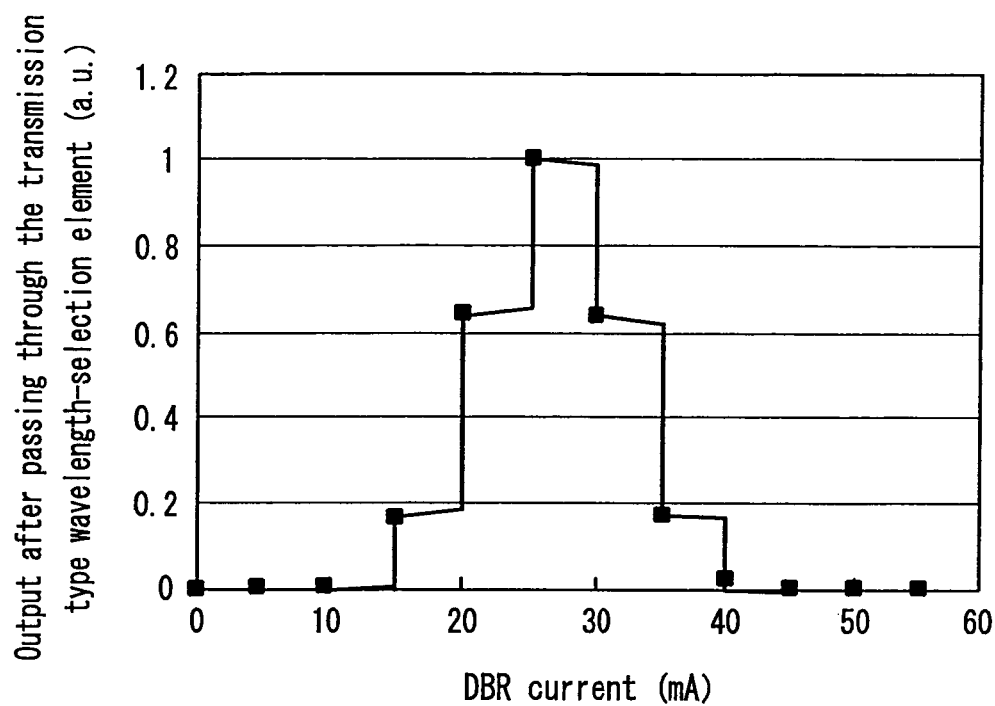
FIG. 6A is a diagram showing the relationship between the DBR current and the output after it has passed through the transmission type wavelength-selection element when the DBR current is changed according to Embodiment 3 of the present invention.
Figure 6B:
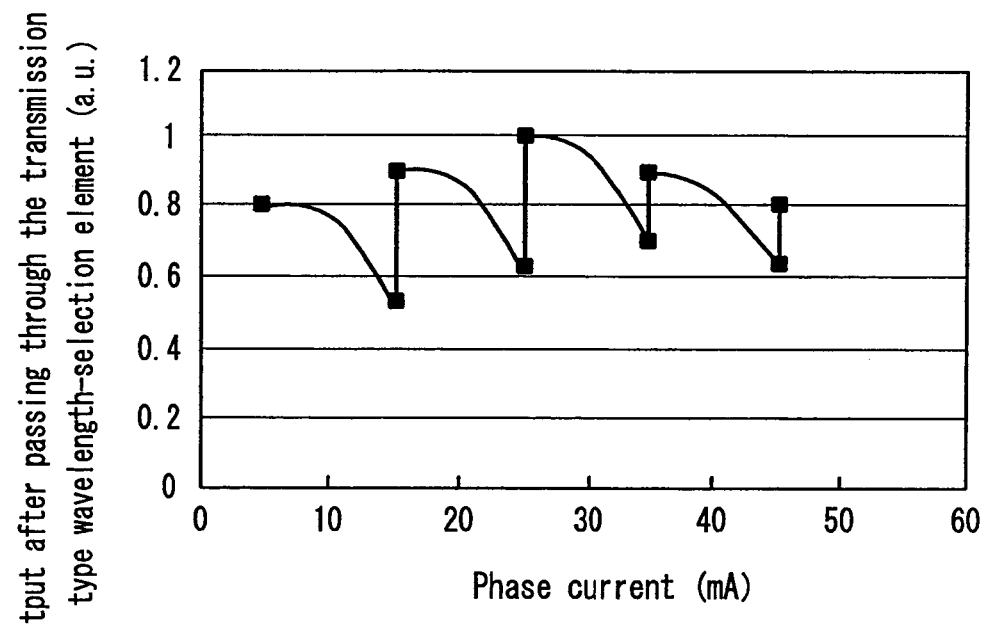
FIG. 6B is a diagram showing the relationship between the DBR current and the output after it has passed through the transmission type wavelength-selection element when the phase current is changed according to Embodiment 3 of the present invention.

The data that are obtained are shown in FIGS. 6A and 6B. In FIGS. 6A and 6B, the vertical axes indicates the relative intensity. From FIG. 6A, the DBR current Idbr (max δ) where Pd(N+1)−Pd(N)>δP, that is, the points of change in the output intensity of the laser beam, is determined, and the average difference δIdbr(max δ) between points is calculated. Also, from FIG. 6B, the phase current Iph (max δ) where Pi(N+1)−Pi(N)>δP is determined, and the average difference δIph(max δ) between points is calculated. Then, from these values, the current ratio Idbr/Iph=δIdbr(max δ)/δIph(max δ) that is required for continuous wavelength variability is calculated. Here, δP is dependent on the wavelength selection properties of the transmission type wavelength-selection element 6 that is used. In this embodiment, δis set to 0.1 Pd(N), which is equivalent to 10% of the maximum output Pd(N). A current ratio Idbr/Iph=0.5 was found from the outcome of FIGS. 6A and 6B.

With the configuration of this embodiment, like Embodiments 1 and 2, the inspection time is dependent on the supply speed when current is supplied to the wavelength-variable DBR semiconductor laser 1 and on the response speed of the photo-detector 3, and inspection on the order of msec (millisecond) or less is possible. This embodiment is characterized in that the current ratio Idbr/Iph can be calculated by scanning the phase current a single time after the DBR current has been scanned once. Thus, inspection of the wavelength variability properties can be performed at even higher speeds, and the practical effects of this are significant.

Embodiment 4

In this embodiment, a semiconductor laser chip and a wavelength conversion element are mounted onto a sub-mount to fabricate a SHG blue light source, and a method for inspecting the wavelength variability properties by detecting the blue light will be described.

Figure 7:
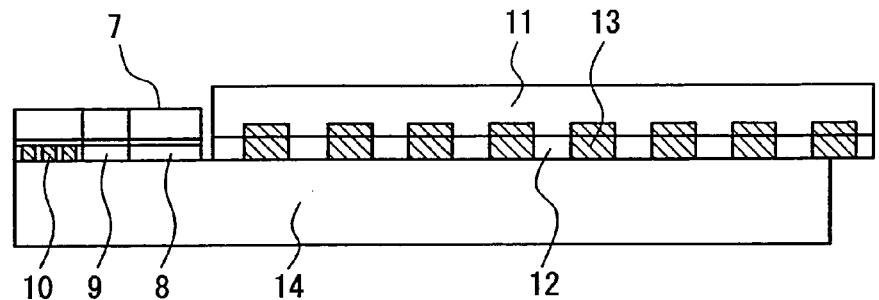
FIG. 7 is a diagram schematically showing the configuration of an SHG blue light source in which an optical waveguide-type QPM-SHG device is used according to Embodiment 4 of the present invention.

FIG. 7 shows a schematic configuration of the SHG blue light source used in this embodiment.

As shown in FIG. 7, in the SHG blue light source of this embodiment, a 0.85 μm band, 100 mW AlGaAs-based wavelength-variable DBR semiconductor laser 7 having an active region 8, a phase control region 9, and a DBR region 10 is employed as the semiconductor laser that serves as the fundamental wave. With this semiconductor laser, changing the DBR current that is supplied to the DBR region 10 can change the oscillation wavelength.

A quasi-phase-matched (hereinafter, referred to as "QPM") optical waveguide-type second harmonic generation (hereinafter, referred to as "SHG") device (optical waveguide-type QPM-SHG device) 11 is adopted for the wavelength conversion element. The optical waveguide-type QPM-SHG device 11 is made of an optical waveguide 12 and periodic polarity inversion regions 13 for augmenting the propagation constant difference between the fundamental wave and the harmonic wave, which are perpendicular to the optical waveguide 12, both formed on the upper surface of an optical crystal substrate (X-cut 5 mol % MgO doped $LiNbO_3$ substrate) of lithium niobate. The optical waveguide 12 is formed by proton-exchange in pyrophosphoric acid. Providing comb-shaped electrodes forms the periodic polarity inversion regions 13 and parallel electrodes in the +x surface of the X-cut 5 mol % MgO doped $LiNbO_3$ substrate and applying an electric field of about 5 kV between the comb-shaped electrodes and the parallel electrodes. A protection film made of $SiO_2$ is formed on the surface, in which the optical waveguide is formed, of the X-cut 5 mol % MgO doped $LiNbO_3$ substrate. With the SHG blue light source of this embodiment, wavelength conversion is achieved by matching the wavelength of the fundamental wave to the phase-matching wavelength of the optical waveguide-type QPM-SHG device 11. At this time, the permissible width of the wavelength where the conversion efficiency is half with respect to the wavelength where maximum conversion efficiency is obtained is about 0.1 nm.

The wavelength-variable DBR semiconductor laser 7 and the optical waveguide-type QPM-SHG device 11 are fixed to a sub-mount 14 so that their surfaces on which the active layer and the optical waveguide 12 are formed are in contact with the sub-mount 14. The laser beam that is emitted from the emission end surface of the wavelength-variable DBR semiconductor laser 7 is directly coupled into the optical waveguide 12 of the optical waveguide-type QPM-SHG device 11.

Optical coupling is adjusted while the wavelength-variable DBR semiconductor laser 7 is emitted, so that 60 mW of laser beam per 100 mW of laser output is coupled into the optical waveguide 12. The DBR current and the phase current of the wavelength-variable DBR semiconductor laser 7 are controlled, so that the oscillation wavelength of the laser is held constant within the phase-matching wavelength permissible limit of the optical waveguide-type QPM-SHG device 11. Currently, about 10 mW of 425 nm wavelength blue light is obtained.

In this embodiment, a method for detecting the output of the harmonic light (blue light) that is obtained by wavelength conversion so as to detect the current ratio of the DBR current to the phase current that is required for continuous wavelength variability will be described. When continuous wavelength variability is achieved, the output of blue light can be stabilized (Yokoyama, et al, Transaction of Institute of Electrical Engineers of Japan C, Vol. 120-C, p. 938, 2000).

The permissible width of the phase-matching wavelength of the optical waveguide-type QPM-SHG device 11 is about 0.1 nm. That is, detection of the blue light is equivalent to detection of the output intensity of the laser beam after it has passed through the transmission type wavelength-selection element in Embodiments 1 to 3, and the optical waveguide-type QPM-SHG device 11 can be thought of as a substitute for the transmission type wavelength-selection element. In this embodiment, a method for inspecting the wavelength variability properties of the wavelength-variable DBR semiconductor laser 7 of the SHG blue light source constituted by the wavelength-variable DBR semiconductor laser 7 and the optical waveguide-type QPM-SHG device 11 will be described.

Figure 8:
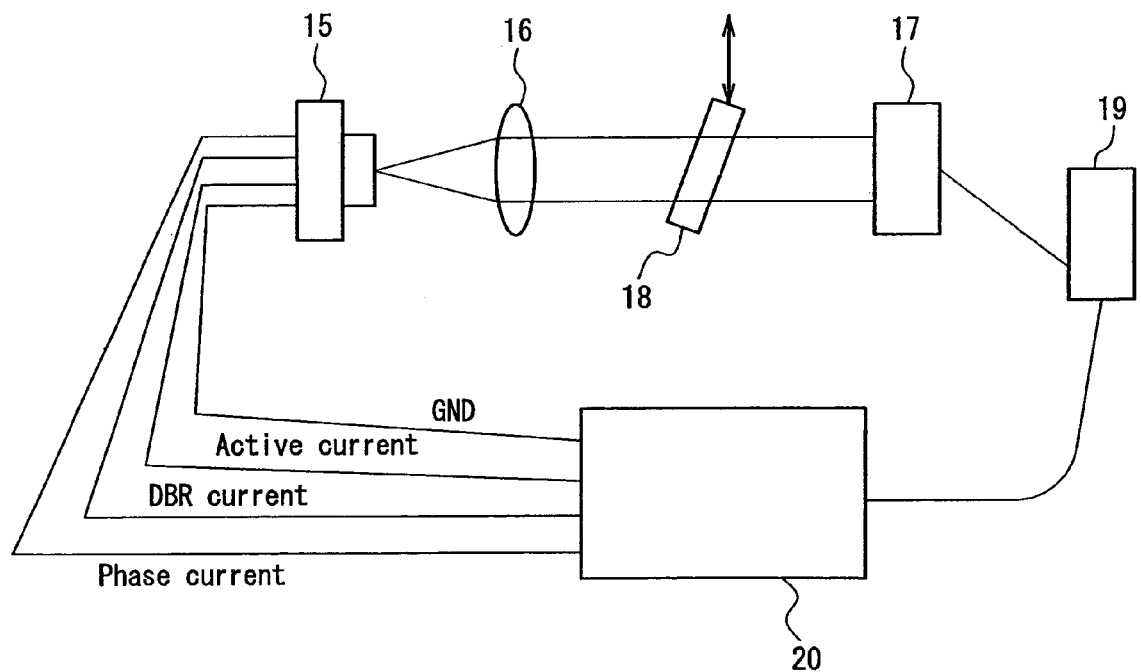
FIG. 8 is a diagram schematically showing the configuration of a device for inspecting a wavelength-variable DBR semiconductor laser according to Embodiment 4 of the present invention.

An inspection method equivalent to that of Embodiment 2 will be described. FIG. 8 shows the inspection device employed in this embodiment.

As shown in FIG. 8, blue light that is emitted from the wavelength-variable DBR semiconductor laser 7 is collimated by a lens 16 and then guided to a photo-detector 17. This inspection device is provided with a fundamental wave cut filter 18 that can be provided in the optical path from the lens 16 to the photo-detector 17. The fundamental wave cut filter 18 blocks fundamental waves that are not wavelength converted. Consequently, the photo-detector 17 can detect only blue light that is obtained through wavelength conversion as signal light. Signal light that is detected by the photo-detector 17 is converted into a digital signal by an A/D converter 19, after which it is stored in a memory of a control circuit 20.

Here, the active current is set to 0XA00 (equivalent to 160 mA, 100 mW). The blue light that is obtained by wavelength conversion is about 10 mW per 100 mW of laser output, and thus the supply current has been set large in order to increase detection accuracy. First, the phase current is set to 0X000(0 mA), and with the phase current held constant, the DBR current is changed in increments of 0X010 (0.5 mA) from 0X010 (0.5 mA) to 0X700 (56 mA). Then, the blue light that is obtained through wavelength conversion is detected by the photo-detector 17, the detected signal is converted into a digital signal by the A/D converter 19, and data $Pd_2 \omega 1(1)$ to $Pd_2 \omega 1(112)$ are stored in a memory of the control circuit 20. Next, the phase current is raised in increments of 0X010 (0.5 mA) from 0X000(0 mA) to 0X500 (40 mA), and for each phase current, the DBR current is changed in increments of 0X010 (0.5 mA) from 0X010 (0.5 mA) to 0X700 (56 mA). Then, the blue light that is obtained through wavelength conversion is detected by the photo-detector 17, the detected signal is converted into a digital signal by the A/D converter 19, and data $Pd_2\omega(1)$ to $Pd_2\omega(112)$ are stored in a memory of the control circuit 20. At this time, the phase current and the DBR current (Iph0 and Idbr0) corresponding to $Pd_2 \omega(N)$, the largest value among $Pd_2 \omega 1(1)$ to $Pd_2 \omega n(112)$ stored in the memory, are determined. In this embodiment, Iph0=20 mA and Idbr0=25 mA were obtained. Here, the phase current when the signal light is largest is determined in order to increase the amount of change in the output intensity across $Pd_2 \omega n(1)$ to $Pd_2 \omega n(112)$, which are obtained when the DBR current is changed.

The method of inspection will be described next.

First, the phase current is set to 0X280 (20 mA), and with the phase current held constant, the DBR current is changed in increments of 0X010 (0.5 mA) from 0X010 (0.5 mA) to 0X700 (56 mA). Then, the blue light that is obtained through wavelength conversion is detected by the photo-detector 17, the detected signal is converted into a digital signal by the A/D converter 19, and data $Pd_2\omega(1)$ to $Pd_2\omega(112)$ are stored in a memory of the control circuit 20. Next, the phase current is set to 0X1E0 (15 mA), which is a 5 mA reduction, and with the phase current held constant, the DBR current is similarly changed in increments of 0X010 (0.5 mA) from 0X010 (0.5 mA) to 0X700 (56 mA). Then, the blue light that is obtained through wavelength conversion is detected by the photo-detector 17, the detected signal is converted into a digital signal by the A/D converter 19, and data $Pd_2\omega 2(1)$ to $Pd_2\omega2(112)$ are stored in a memory of the control circuit 20. Next, the phase current is set to 0X320 (25 mA), which is a 5 mA increase, and with the phase current held constant, the DBR current is similarly changed in increments of 0X010 (0.5 mA) from 0X010 (0.5 mA) to 0X700 (56 mA). Then, the blue light that is obtained through wavelength conversion is detected by the photo-detector 17, the detected signal is converted into a digital signal by the A/D converter 19, and data $Pd_2\omega3(1)$ to $Pd_2\omega3(112)$ are stored in a memory of the control circuit 20.

Figure 9:
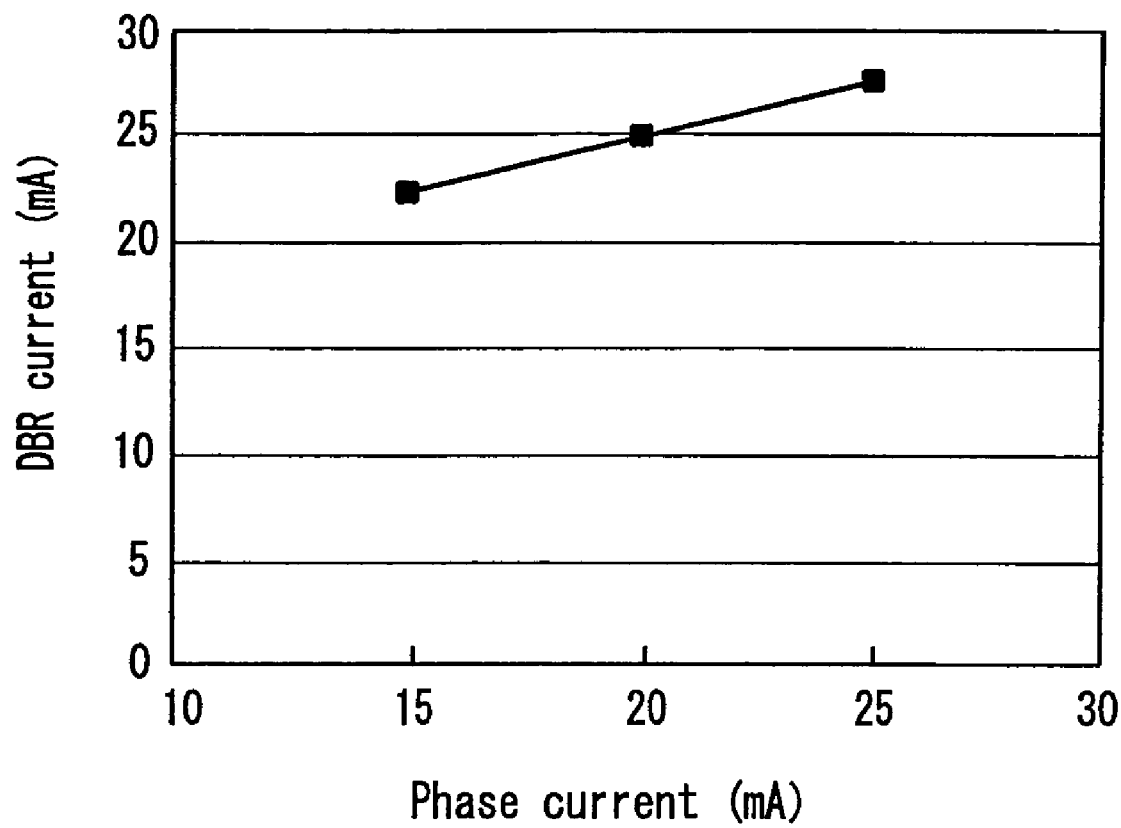
FIG. 9 is a diagram showing the relationship between the phase current and the DBR current corresponding to the points of change in the output according to Embodiment 4 of the present invention.

Using the data stored in the memory, the DBR current values where $Pd_2\ \omega1(N+1)-Pd_2\omega1(N)$, $Pd_2\ \omega2(N+1)-Pd_2\omega2(N)$, and $Pd_2\ \omega3(N+1)-Pd_2\omega3(N)$ are largest with respect to the each phase current, that is, the DBR current corresponding to the points of change in the output intensity, are determined (however, in this embodiment, negative values are ignored). The result is shown in FIG. 9. The slope of the line joining the three points is the current ratio Idbr/Iph, which is Idbr/Iph=0.5.

The results in FIG. 9 are substantially similar to the results in FIG. 5. With the SHG blue light source constituted by the wavelength-variable DBR semiconductor laser and the optical waveguide-type QPM-SHG device, the blue light output that is obtained through wavelength conversion is detected in place of using the transmission type wavelength selection element, so that the wavelength variability properties of the wavelength-variable DBR semiconductor laser similarly can be found, and the current ratio Idbr/Iph that is required for continuous wavelength variability can be found easily.

An inspection method equivalent to that of Embodiment 3 also can be employed to inspect the wavelength variability properties. The following is a description of this method.

When an inspection method equivalent to that of Embodiment 3 is adopted, it is necessary to detect the points of change in the output intensity when the phase current is changed. Thus, if the wavelength permissible width for phase matching of the optical waveguide type QPM-SHG device is small, then the points of change in the output intensity cannot be detected. In this embodiment, an optical waveguide type QPM-SHG device with an element length of 5 mm and a wavelength permissible width of 0.2 nm is employed.

Here, the active current is set to 0XA00 (equivalent to 160 mA, 100 mW). The blue light that is obtained through wavelength conversion is about 10 mW per 100 mW of laser output, and thus the supply current has been set large in order to increase detection accuracy. First, the phase current is set to 0X000(0 mA), and with the phase current held constant, the DBR current is changed in increments of 0X010 (0.5 mA) from 0X010 (0.5 mA) to 0X700 (56 mA). Then, the blue light that is obtained through wavelength conversion is detected by the photo-detector 17, the detected signal is converted into a digital signal by the A/D converter 19, and data $Pd_2\omega(1)$ to $Pd_2\omega(112)$ are stored in a memory of the control circuit 20. Next, the DBR current is held constant at the Idbr (25 mA) corresponding to $Pd_2\omega(N)$, the largest value among $Pd_2\omega(1)$ to $Pd_2\omega(112)$, and the phase current is changed in increments of 0X010 (0.5 mA) from 0X000 (0 mA) to 0X700 (56 mA). Then, the blue light that is obtained through wavelength conversion is detected by the photo-detector 17, the detected signal is converted into a digital signal by the A/D converter 19, and data $Pi_2\ \omega(1)$ to $Pi_2\ \omega(112)$ are stored in a memory of the control circuit 20.

Figure 10A:
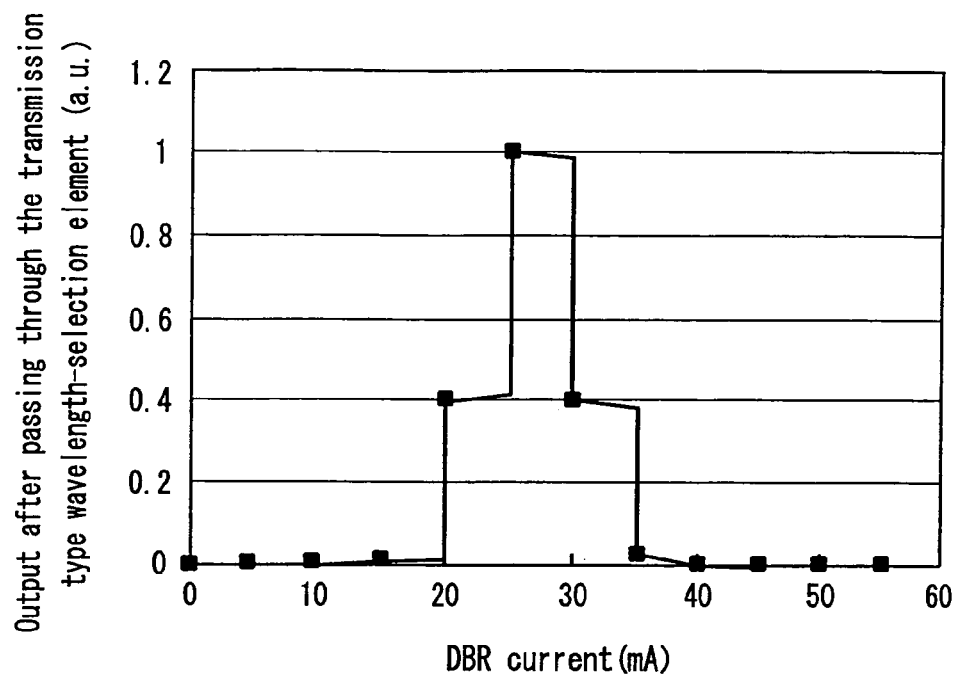
FIG. 10A is a diagram showing the relationship between the DBR current and the output after it has passed through the transmission type wavelength-selection element when the DBR current is changed according to Embodiment 4 of the present invention.
Figure 10B:
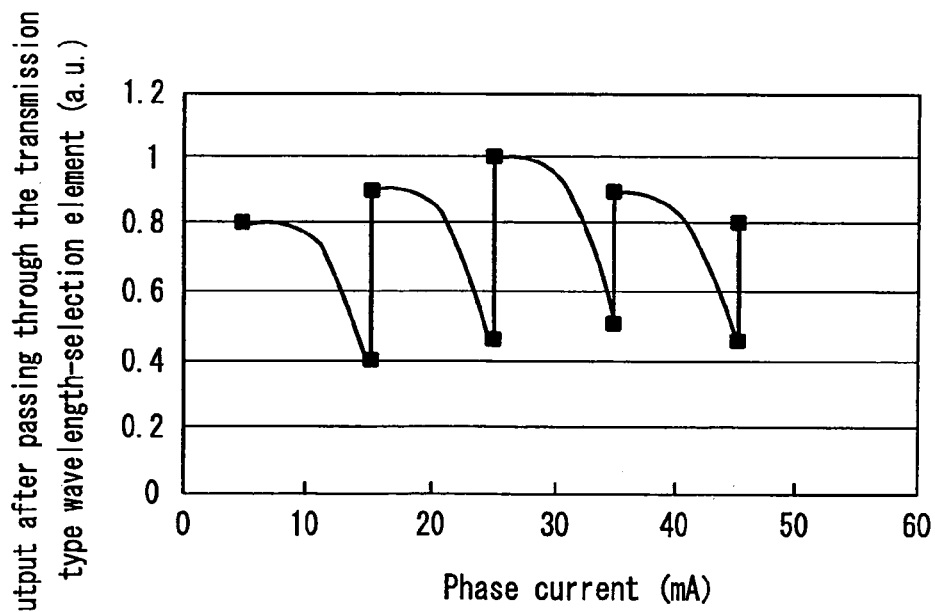
FIG. 10B is a diagram showing the relationship between the DBR current and the output after it has passed through the transmission type wavelength-selection element when the phase current is changed according to Embodiment 4 of the present invention.

The data that are obtained are shown in FIGS. 10A and 10B. In FIGS. 10A and 10B, the vertical axes indicates the relative intensity. From FIG. 10A, the DBR current Idbr (max δ) where $Pd_2\ \omega(N+1)-Pd_2\ \omega(N)>\delta P$, that is, the points of change in the output intensity, is determined, and the average difference δIdbr(max δ) between these points is calculated. Also, from FIG. 10B, the phase current Iph (max δ) where $Pi_2\ \omega(N+1)-Pi_2\ \omega(N)>\delta P$ is determined and the average difference δIph(max δ) between these points is calculated. Then, from these values, the current ratio Idbr/Iph=δIdbr(max δ)/δIph(max δ) that is required for continuous wavelength variability is calculated. In this embodiment, δP is set to 0.2 Pd(N), which is equivalent to 20% of the maximum output Pd(N). A current ratio Idbr/Iph=0.5 was found from FIGS. 10A and 10B.

It should be noted that this embodiment was described with regard to an SHG blue light source constituted by the wavelength-variable DBR semiconductor laser 7 and the optical waveguide-type QPM-SHG device 11, but the same effects can be attained with an SHG blue light source constituted by a wavelength-variable DBR semiconductor laser and a bulk-type QPM-SHG device. Additionally, the same effects can be attained when using a phase-matching SHG device that employs birefringence.

As set forth above, in the inspection of a SHG blue light source constituted by the wavelength-variable DBR semiconductor laser 7 and the optical waveguide-type QPM-SHG device 11, it is not necessary to inspect the wavelength-variable DBR semiconductor laser 7 unit, and by evaluating the wavelength conversion properties of the SHG blue light source after mounting and assembly, 1) output properties and wavelength variability properties, for example, of the wavelength-variable DBR semiconductor laser, and 2) the current ratio required for continuous wavelength variability in order to stabilize output of the SHG blue light source, can be inspected together. As a result, a reduction in the inspection time can be achieved, and thus there is a large practical benefit.

A characteristic of this embodiment is the large change in output at the points of change in the output intensity, as shown in FIGS. 10A and 10B. FIGS. 6A and 6B of Embodiment 3 show how the output changes when the laser beam emitted from the wavelength-variable DBR semiconductor laser 1 is directly received by the photo-detector 3. With the SHG blue light source, the harmonic light output that is obtained is proportional to the square of the change in output of the semiconductor laser beam, that is, the fundamental wave. For that reason, if the harmonic light obtained through second harmonic generation is received as signal light, then the change in output at the points of change in output intensity can be increased, and consequently, the detection precision can be increased.

Embodiment 5

In this embodiment, a method for finding the current ratio Idbr/Iph of the DBR current to the phase current that is required for continuous wavelength variability without employing a transmission type wavelength selection element will be described.

The wavelength-variable DBR semiconductor laser has three regions. These are an active region, a phase control region, and a distributed Bragg reflector (DBR) region. When the DBR current and the phase current are supplied to the DBR region and the phase control region, respectively, the temperature rises due to internal resistance, and the refractive index is changed. For that reason, in the DBR region, the wavelength of the reflected light is changed, and in the phase control region, the phase state of the resonator constituted by the emission end surface on the active region side and the DBR region is changed. Stepwise wavelength variability properties are obtained when the DBR current and the phase current are changed because the phase state changes and the number of waves in the resonator changes. The change in the phase state and the number of waves in the resonator causes the oscillation state of the wavelength-variable DBR semiconductor laser to change, and thus the output intensity that is obtained also is changed.

Figure 11:
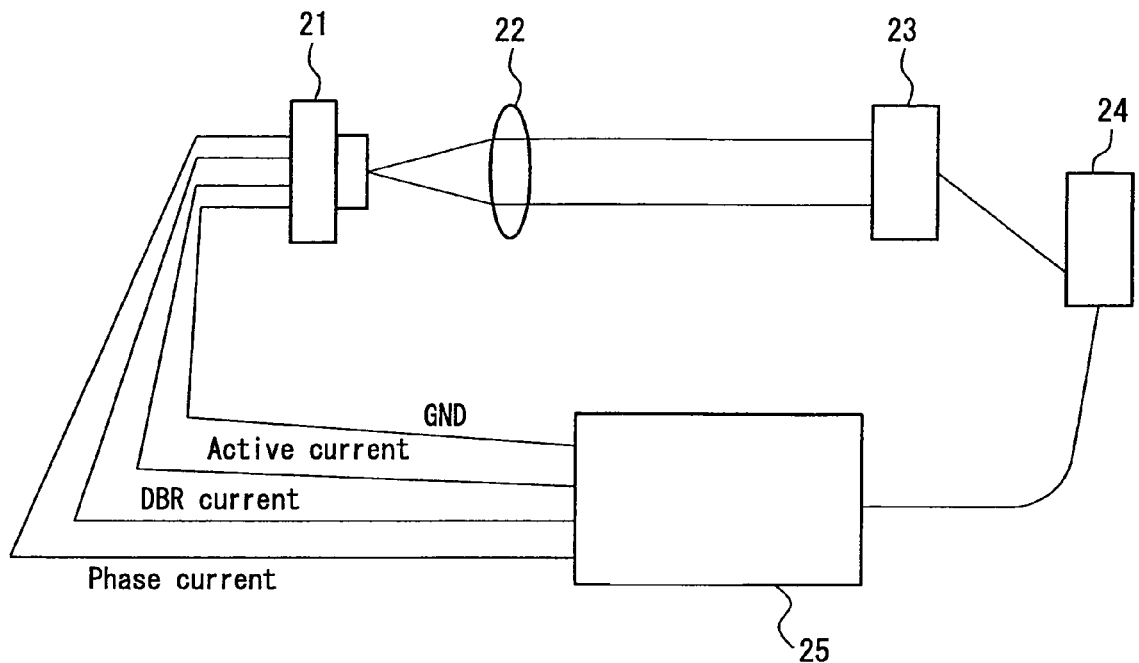
FIG. 11 is a diagram schematically showing the configuration of a device for inspecting a wavelength-variable DBR semiconductor laser according to Embodiment 5 of the present invention.

FIG. 11 shows the inspection device that is employed in this embodiment. A transmission type wavelength-selection element is not necessary in the inspection device of this embodiment.

As shown in FIG. 11, the laser beam emitted from a wavelength-variable DBR semiconductor laser 21 is converted into parallel light by a lens 22, after which it is guided directly to a photo-detector 23. The signal light that is detected by the photo-detector 23 is converted into a digital signal by an A/D converter 24 and stored in a memory of a control circuit 25.

Figure 12:
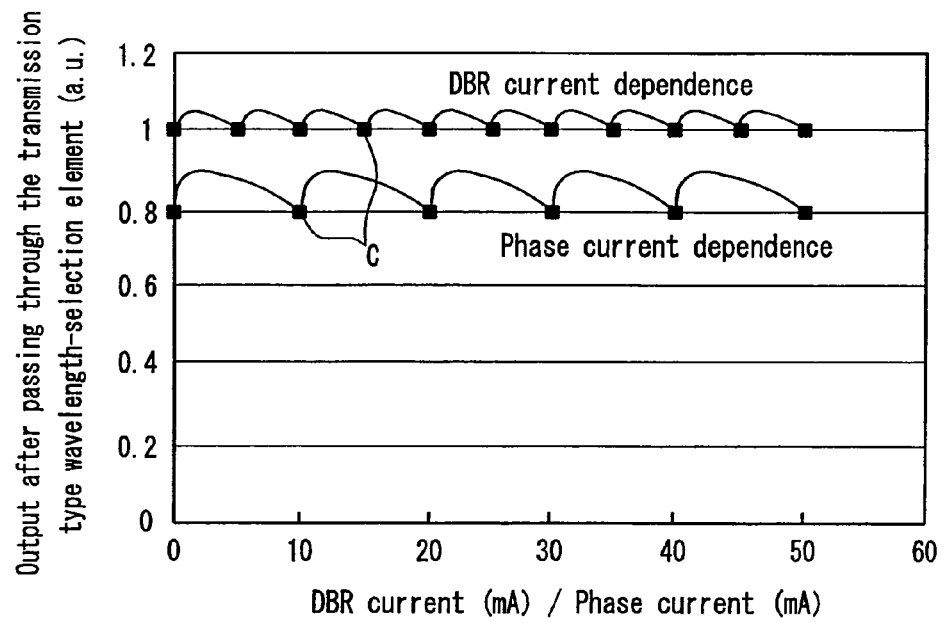
FIG. 12 is a diagram showing the relationship between the DBR current and the output after it has passed through the transmission type wavelength-selection element when the DBR current and the phase current are changed according to Embodiment 5 of the present invention.

FIG. 12 shows the output intensity of the wavelength-variable DBR semiconductor laser when the active current is set to 100 mA and the DBR current and the phase current are changed. In FIG. 12, the vertical axis indicates the relative intensity. The points C in FIG. 12 are the points at which the number of waves changes, and are equivalent to the points A shown in FIG. 15 of the prior art. The points of change in the output intensity that are determined in Embodiment 3 are the points C in FIG. 12, and thus by finding the current difference between the points C for both the DBR current and the phase current, it is possible to calculate the current ratio Idbr/Iph of the DBR current to the phase current that is required for continuous wavelength variability.

The actual inspection method will be described below. Here, the active current is set to 0X640 (equivalent to 100 mA, 50 mW). First, the phase current is set to 0X000 (0 mA), and with the phase current held constant, the DBR current is changed in increments of 0X010 (0.5 mA) from 0X010 (0.5 mA) to 0X700 (56 mA). Then, the signal light detected by the photo-detector 23 is converted into a digital signal by the A/D converter 24, and data Pd(1) to Pd(112) are stored in a memory of the control circuit 25. Next, the DBR current is set to 0X000 (0 mA) and the phase current is changed in increments of 0X010 (0.5 mA) from 0X010 (0.5 mA) to 0X700 (56 mA). Then, the signal light detected by the photo-detector 23 is converted into a digital signal by the A/D converter 24 and data Pi(1) to Pi(112) are stored in a memory of the control circuit 25.

The points where the values of Pd(1) to Pd(112) and Pi(1) to Pi(112) change from negative to positive correspond to the points C in FIG. 12. The points at which these values change from negative to positive are determined, and the average values of the difference $\delta Idbr(\pm)$ and $\delta Iph(\pm)$ between these points are calculated. From these values, the current ratio $Idbr/Iph=\delta Idbr(\pm)/\delta Iph(\pm)$ that is required for continuous wavelength variation is calculated. In this embodiment, a current ratio Idbr/Iph=0.5 was found.

In the configuration of this embodiment, the inspection time is dependent on the supply speed when current is supplied to the wavelength-variable DBR semiconductor laser 21 and on the response speed of the photo-detector 23, and inspection on the order of msec (millisecond) or less is possible. Also, the current ratio Idbr/Iph can be calculated simply by scanning the phase current a single time after the DBR current has been scanned once. Furthermore, by investigating that the difference between the points of change in the output intensity is constant in the wavelength variability region, then a general picture of the wavelength variability properties also can be investigated. When this difference is unstable, it either means that the longitudinal mode is becoming multimode or that the wavelength variability is unstable.

The method for inspecting of this embodiment differs from those of Embodiments 1 to 3 in that it does not require a transmission type wavelength-selection element, and therefore it is a practical inspection method in which a device like a conventional semiconductor laser inspection device can be employed. However, the output change shown in FIG. 12 is dependent on the amount of diffracted light at the emission end surface and the DBR region of the wavelength-variable DBR semiconductor laser 21. Particularly in the case of high output semiconductor lasers, the reflectivity of the emission end surface is small, and therefore it is difficult to detect changes in the output thereof. With the configuration of Embodiments 1 to 4, the detectable signal and the amount that this signal changes are both large. Furthermore, with Embodiments 1 to 4, the current ratio Idbr/Iph near a desirable wavelength, such as the phase-matching wavelength, can be found.

With the inspection method of this embodiment, the same effects can be obtained with an SHG blue light source constituted by a wavelength-variable DBR semiconductor laser and an optical waveguide-type QPM-SHG device. However, with an SHG blue light source, when the oscillation wavelength of the wavelength-variable DBR semiconductor laser matches the phase-matching wavelength of the optical waveguide-type QPM-SHG device, then the semiconductor laser beam that is obtained from the emission portion of the optical waveguide is decreased due to wavelength conversion, and output fluctuation is caused as a result. For that reason, performing inspection in a wavelength region that is removed from the phase-matching wavelength results in a more precise inspection. By detecting the blue light output that is obtained through wavelength conversion, the wavelength variability properties similarly can be obtained, and also the current ratio Idbr/Iph that is required for continuous wavelength variability can be found easily.

Embodiment 6

In Embodiments 1 to 3, methods for inspecting the wavelength variability properties of a wavelength-variable DBR semiconductor laser using a transmission type wavelength-selection element were described. In Embodiment 4, a method for inspecting the wavelength variability properties of a wavelength-variable DBR semiconductor laser by detecting the blue light that is wavelength converted by an optical waveguide-type QPM-SHG device was described. By extension, it is clear that an optical waveguide-type QPM-SHG device can be used in place of transmission type wavelength-selection element in order to inspect the wavelength variability properties of a wavelength-variable DBR semiconductor laser. However, when an optical waveguide-type QPM-SHG device is used, the laser beam that is emitted from the wavelength-variable DBR semiconductor laser must be optically coupled into the optical waveguide of the optical waveguide-type QPM-SHG device, and this is inconvenient for practical use. Accordingly, in this embodiment, a method for inspecting the wavelength variability properties of a wavelength-variable DBR semiconductor laser using a bulk-type QPM-SHG device will be described.

First, the method for fabricating a bulk-type QPM-SHG device will be described. Periodic polarity inversion regions are formed on a 1 mm thick Z-cut $LiTaO_3$ substrate. Providing comb-shaped electrodes on the +z surface of the Z-cut LiTaO$_3$ substrate and rear surface electrodes on the −z surface, and then applying an electric field of about 20 kV between the comb-shaped electrodes and the reverse surface electrodes forms the periodic polarity inversion regions. The polarity inversion period is 10 μm, and is set to third-order quasi-phase-match. The length of the element is 3 mm, and the permissible width of the wavelength with half the conversion efficiency is 0.3 nm with respect to the wavelength where maximum conversion efficiency is obtained. The permissible width is dependent on the length of the element, and can be expanded to up to about 1 nm by providing the element with a length of 1 mm.

Figure 13:
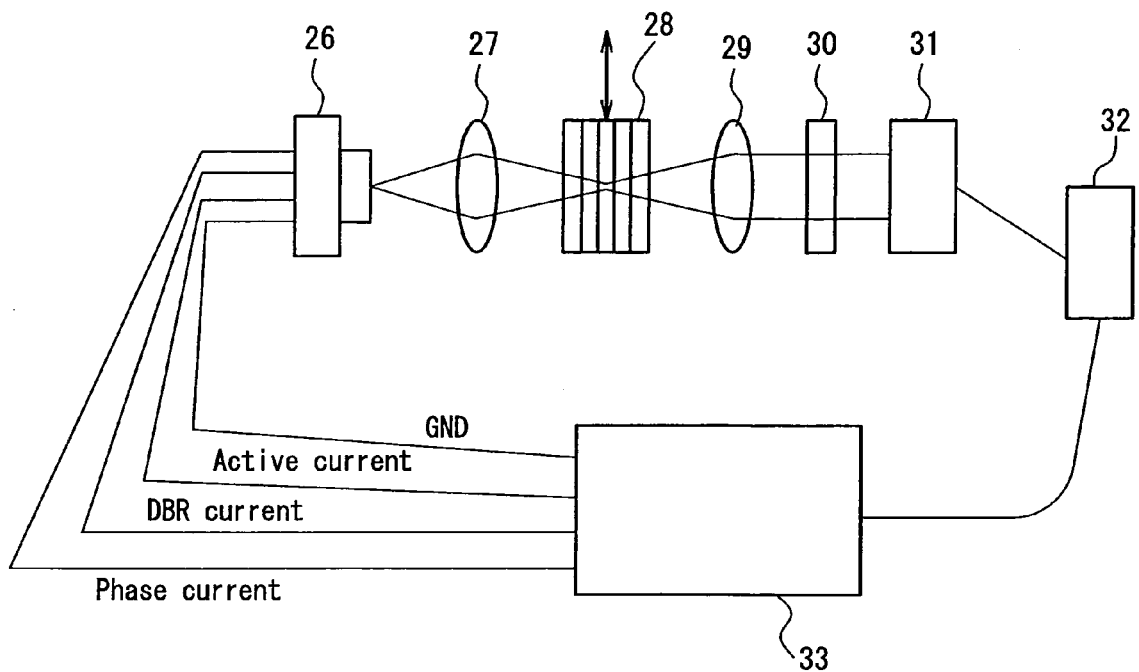
FIG. 13 is a diagram schematically showing the configuration of a device for inspecting a wavelength-variable DBR semiconductor laser according to Embodiment 6 of the present invention.
Figure 14:
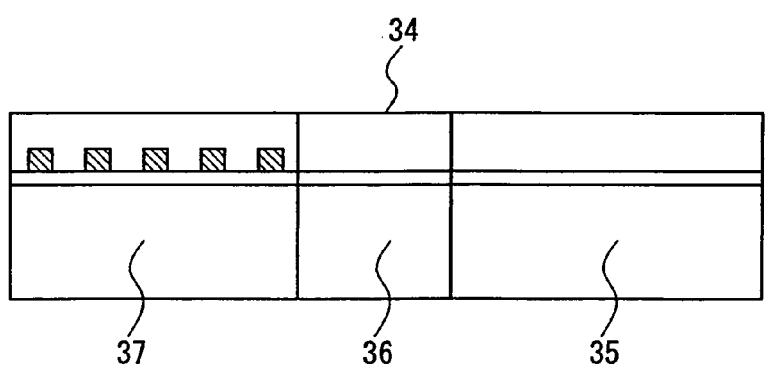
FIG. 14 is a diagram schematically showing the configuration of a wavelength-variable DBR semiconductor laser according to the prior art.

FIG. 13 shows the inspection device that is used in this embodiment.

As shown in FIG. 13, the laser beam that is emitted from a wavelength-variable DBR semiconductor laser 26 is collimated by a lens 27 and focused to a bulk-type QPM-SHG device 28. The laser beam focused to the bulk-type QPM-SHG device 28 is wavelength converted there and becomes blue light (harmonic light). The blue light is collimated by a lens 29, after which it is guided into a photo-detector 31. In this embodiment, a sample with an element length of 3 mm and a permissible width of 0.3 nm is used. This inspection device is provided with a fundamental wave cut filter 30 on the light path from the lens 29 to the photo-detector 31, and the fundamental wave cut filter 30 blocks fundamental waves that are not wavelength converted. Consequently, only the blue light that is obtained through wavelength conversion can be detected as signal light by the photo-detector 31.

With the configuration of this embodiment, the output of blue light that is obtained by the bulk-type QPM-SHG device 28 is small, and thus the load resistance of the photo-detector 31 is increased so as to increase its sensitivity. Fundamental waves that are focused to the bulk-type QPM-SHG device have a smaller power density and a shorter interaction length than when an optical waveguide-type QPM-SHG device is employed, and as a consequence the conversion efficiency is reduced. Therefore, the response speed of the photo-detector is two orders of magnitude slower than the photo-detector that is employed in Embodiment 1. The signal light that is detected by the photo-detector 31 is converted into a digital signal by an A/D converter 32 and stored in a memory of a control circuit 33. A 12-bit microcomputer is used as a control microcomputer.

The inspection method will be described below.

The detection of the blue light is equivalent to detection of the output intensity of the laser beam after it has passed through the transmission type wavelength-selection element in Embodiments 1 to 3, and the bulk-type QPM-SHG device 28 can be thought of as a substitute for the transmission type wavelength-selection element. Accordingly, a method similar to that of Embodiment 4 can be employed to inspect the wavelength variability properties of the wavelength-variable DBR semiconductor laser 26.

An inspection method equivalent to that of Embodiment 2 will be described in brief.

Here, the active current is set to 160 mA (equivalent to 100 mW). The blue light that is obtained through wavelength conversion is about 100 μW per 100 mW of laser output. First, the phase current is set to 0 mA, and with the phase current held constant, the DBR current is changed from 0 mA up to 50 mA. Then, the blue light that is obtained through wavelength conversion is detected by the photo-detector 31, the detected signal is converted into a digital signal by the A/D converter 32, and data Pd$_2$ ω1(1) to Pd$_2$ ω1(N) are stored in a memory of the control circuit 33. Next, the phase current is raised from 0 mA up to 40 mA, and in correspondence to each phase current, the DBR current is changed from 0 mA up to 50 mA. Then, the blue light that is obtained through wavelength conversion is detected by the photo-detector 31, the detected signal is converted into a digital signal by the A/D converter 32, and data Pd$_2$ωn(1) to Pd$_2$ωn(N) are stored in a memory of the control circuit 33. At this time, the phase current and the DBR current (Iph0, Idbr0) each corresponding to the largest value among Pd$_2$ ω1(1) to Pd$_2$ ωn(N) stored in the memory are determined.

The phase current is set to Iph0, and with the phase current held constant, the DBR current is changed from 0 mA up to 50 mA. Then, the blue light that is obtained through wavelength conversion is detected by the photo-detector 31, the detected signal is converted into a digital signal by the A/D converter 32, and data Pd$_2$ ω1(1) to Pd$_2$ ω1(N) are stored in a memory of the control circuit 33. Next, the phase current is set to Iph0−5 mA, and with the phase current held constant, the DBR current is similarly changed from 0 mA up to 50 mA. Then, the blue light that is obtained through wavelength conversion is detected by the photo-detector 31, the detected signal is converted into a digital signal by the A/D converter 32, and data Pd$_2$ω2(1) to Pd$_2$ω2(N) are stored in a memory of the control circuit 33. Next, the phase current is set to Iph0+5 mA, and with the phase current held constant, the DBR current is similarly changed from 0 mA up to 50 mA. Then, the blue light that is obtained through wavelength conversion is detected by the photo-detector 31, the detected signal is converted into a digital signal by the A/D converter 32, and data Pd$_2$ ω3(1) to Pd$_2$ ω3(N) are stored in a memory of the control circuit 33.

Using the data stored in the memory, the DBR current values where Pd$_2$ ω1(N+1)−Pd$_2$ ω1(N), Pd$_2$ ω2(N+1)−Pd$_2$ω2(N), and Pd$_2$ ω3(N+1)−Pd$_2$ω3(N) are largest with respect to each of the phase currents, that is, the DBR current corresponding to the points of change in output intensity, are determined (however, in this embodiment, negative values are ignored). Thus, results similar to those shown in FIG. 9 are obtained, and the slope of the line joining these three points is the current ratio Idbr/Iph.

Furthermore, wavelength variability properties can be inspected through an inspection method that is equivalent to that of Embodiment 3. Such a method will be described below.

Here, the active current is set to 160 mA (equivalent to 100 mW). First, the phase current is set to 0 mA, and with the phase current held constant, the DBR current is changed from 0 mA up to 50 mA. Then, the blue light that is obtained through wavelength conversion is detected by the photo-detector 31, the detected signal is converted into a digital signal by the A/D converter 32, and data Pd$_2$ω(1) to Pd$_2$ω(N) are stored in a memory of the control circuit 33. Next, the DBR current is held constant at Idbrmax, where Pd$_2$ω(N) is largest, and the phase current is changed from 0 mA up to 50 mA. Then, the blue light that is obtained through wavelength conversion is detected by the photo-detector 31, the detected signal is converted into a digital signal by the A/D converter 32, and data Pi$_2$ ω(1) to Pi$_2$ ω(N) are stored in a memory of the control circuit 33.

Through the above method, results similar to those of FIGS. 10A and 10B were obtained. From FIG. 10A, the DBR current Idbr (max δ) where Pd$_2$ ω(N+1)−Pd$_2$ ω(N)>δP, that is, the points of change in the output intensity, are determined, and the average difference δIdbr(max δ) between these points is calculated. Also, from FIG. 10B, the phase current Iph (max δ) where $Pi_2 \omega(N+1) - Pi_2 \omega(N) > \delta P$ is determined, and the average difference δIph(max δ) between these points is calculated. Then, from these values, the current ratio Idbr/Iph=δIdbr(max δ)/δIph(max δ) that is required for continuous wavelength variability is calculated.

It should be noted that this embodiment has been described with regard to methods for inspecting a wavelength-variable DBR semiconductor laser by using a bulk-type QPM-SHG device. Characteristics of bulk-type QPM-SHG devices reside in their ease of fabrication and low cost. A further characteristic of bulk-type QPM-SHG devices is that the wavelength selection width (permissible width) can be altered with high precision through cutting and polishing after the element has been fabricated. The longitudinal mode spacing (mode hop spacing) of a wavelength-variable DBR semiconductor laser is dependent on the resonator length. Consequently, the methods of this embodiment are effective when selecting the optimal permissible width. Also, SHG is employed in this embodiment like in Embodiment 4, and thus the change in output between the points of change in the output intensity is large. In a case where harmonic light that is obtained through second harmonic generation is received as signal light, the output change between the points of change in output intensity can be increased. Consequently, the detection precision can be increased.

In the foregoing description, the present invention is a device for inspecting a wavelength-variable semiconductor laser having at least an active region, a phase control region, and a distributed Bragg reflector (DBR) region, and is provided with a power source for supplying current to the active region, the phase control region, and the DBR region, a photo-detector for detecting an output intensity of laser beam that is emitted from the wavelength-variable semiconductor laser, and a transmission type wavelength-selection element that can be inserted into a light path from the wavelength-variable semiconductor laser to the photo-detector. In a state where the transmission type wavelength-selection element is inserted into the light path from the wavelength-variable semiconductor laser to the photo-detector, at least one of a phase current that is supplied to the phase control region and a DBR current that is supplied to the DBR region is changed with respect to a predetermined active current that is supplied to the active region, and the output intensity of the laser beam after the laser beam has passed through the transmission type wavelength-selection element is detected by the photo-detector and the phase current and the DBR current corresponding to points of change in the output intensity are determined. Thus, the stability of the wavelength variability of the wavelength-variable DBR semiconductor laser and the current ratio Idbr/Iph that is required for continuous wavelength variability, for example, can be easily and quickly inspected.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes, which come within the meaning and range of equivalency of the claims, are intended to be embraced therein.

What is claimed is:

1. A device for inspecting a wavelength-variable semiconductor laser having at least an active region, a phase control region, and a distributed Bragg reflector (DBR) region, comprising:

a power source for supplying an active current to the active region, a phase current to the phase control region, and a DBR current to the DBR region;

a photo-detector for detecting an output intensity of laser beam emitted from the wavelength-variable semiconductor laser;

a second harmonic generation (SHG) element that that is inserted into a light path from the wavelength-variable semiconductor laser to the photo-detector; and a control circuit provided between the photo-detector and the wavelength-variable semiconductor laser;

wherein when a constant active current is supplied to the active region, the phase current that is supplied to the phase control region and the DBR current that is supplied to the DBR region are each changed independently, the output intensity of the harmonic light that is wavelength converted by the SHG element is detected by the photo-detector, and the phase current and the DBR current corresponding to points of change in the output intensity are determined by the control circuit, and wherein the control circuit calculates a current ratio ΔIdbr/ΔIph of the DBR current to the phase current from a DBR current difference ΔIdbr corresponding to the points of change in the output intensity that are obtained when the DBR current is changed, and a phase current difference ΔIph corresponding to the points of change in the output intensity that are obtained when the phase current is changed.

2. The device for inspecting a wavelength-variable semiconductor laser according to claim 1, wherein at least one of the phase current that is supplied to the phase control region and the DBR current that is supplied to the DBR region is changed with respect to a predetermined active current that is supplied to the active region, and the output intensity of the harmonic light that has been wavelength convened by the SHG element is detected by the photo-detector.

3. A method for inspecting a wavelength-variable semiconductor laser in which the inspection device according to claim 1 is used, wherein in a state where a constant active current is supplied to the active region, the DBR current that is supplied to the DBR region is changed, the output intensity of the harmonic light that is wavelength converted by the SHG element is detected by the photo-detector, and the DBR current corresponding to a desirable wavelength of the wavelength-variable semiconductor laser is determined.

4. The method for inspecting a wavelength-variable semiconductor laser according to claim 3, wherein the desirable wavelength of the wavelength-variable semiconductor laser is a wavelength where the output intensity of the harmonic light that is wavelength converted by the SHG element is largest.

5. A method for inspecting a wavelength-variable semiconductor laser in which the inspection device according to claim 1 is used, wherein a current ratio of the phase current to the DBR current is calculated from the phase current and the DBR current corresponding to the points of change in the output intensity.

6. The method for inspecting a wavelength-variable able semiconductor laser according to claim 5, wherein the current ratio of the DBR current to the phase current is calculated and the DBR current arid the phase current are kept at the current ratio, so as to change an oscillation wavelength of the wavelength-variable semiconductor laser continuously.

7. A method for inspecting a wavelength-variable semiconductor laser in which the inspection device according to claim 1 is used, wherein the current ratio of the DBR current to the phase current is calculated and the DUR current and the phase current are kept at the current ratio, so as to change an oscillation wavelength of the wavelength-variable semiconductor laser continuously.

* * * * *

UNITED STATES PATENT AND TRADEMARK OFFICE
CERTIFICATE OF CORRECTION

PATENT NO. : 7,082,146 B2 Page 1 of 1
APPLICATION NO. : 11/197624
DATED : July 25, 2006
INVENTOR(S) : Kitaoka et al.

It is certified that error appears in the above-identified patent and that said Letters Patent is hereby corrected as shown below:

Title Page, Item (56)
Page 2, second column, line 8(other publications): "Juen 1" should read --June 1--
Column 24, line 38(claim 2): "convened" should read --converted--
Column 24, line 67(claim 6): "arid" should read --and--
Column 26, line 1(claim 7): "DUR" should read --DBR--

Signed and Sealed this

Sixth Day of March, 2007

JON W. DUDAS
*Director of the United States Patent and Trademark Office*